United States Patent
Nishimura

(10) Patent No.: US 7,352,243 B2
(45) Date of Patent: Apr. 1, 2008

(54) VOLTAGE COMPARATOR CIRCUIT

(75) Inventor: Kouichi Nishimura, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 79 days.

(21) Appl. No.: 11/148,195

(22) Filed: Jun. 9, 2005

(65) Prior Publication Data

US 2005/0275459 A1 Dec. 15, 2005

(30) Foreign Application Priority Data

Jun. 9, 2004 (JP) .............................. 2004-171047

(51) Int. Cl.
*H03F 3/45* (2006.01)
(52) U.S. Cl. ...................... 330/257; 330/255; 330/263; 330/264
(58) Field of Classification Search ................ 330/257, 330/255, 263–264
See application file for complete search history.

(56) References Cited

U.S. PATENT DOCUMENTS 6,433,637 B1 * 8/2002 Sauer .......................... 330/255

FOREIGN PATENT DOCUMENTS

JP 3-62712 3/1991

OTHER PUBLICATIONS

A Compact Power-Efficient 3 V CMOS Rail-to-Rail Input/Output Operational Amplifier for VLSI Cell Libraries, Journal of Solid State Circuits, vol. 29. No. 12,R Hogerworst et al.

* cited by examiner

*Primary Examiner*—Robert Pascal
*Assistant Examiner*—Hieu Nguyen
(74) *Attorney, Agent, or Firm*—Young & Thompson

(57) ABSTRACT

A voltage comparator that realizes high-speed operation with a simple structure includes an input differential stage having a first differential pair and a second differential pair, into which a differential voltage is inputted from differential input terminals $In^+$ and $In^-$, with reverse polarity to each other, folded cascode-type differential stages, which adds a differential output signal of the first differential pair and a differential output signal of the second differential pair and is connected to a differential output of the input differential stage, and oppositely disposed first and second current mirror circuits, which receive differential outputs of the folded cascode-type differential stages into their respective inputs, with reverse polarity to each other and their outputs connected in common to an output terminal. The folded cascode-type differential stage adds the differential output signal of the first differential pair and the differential output signal of the second differential pair.

21 Claims, 11 Drawing Sheets

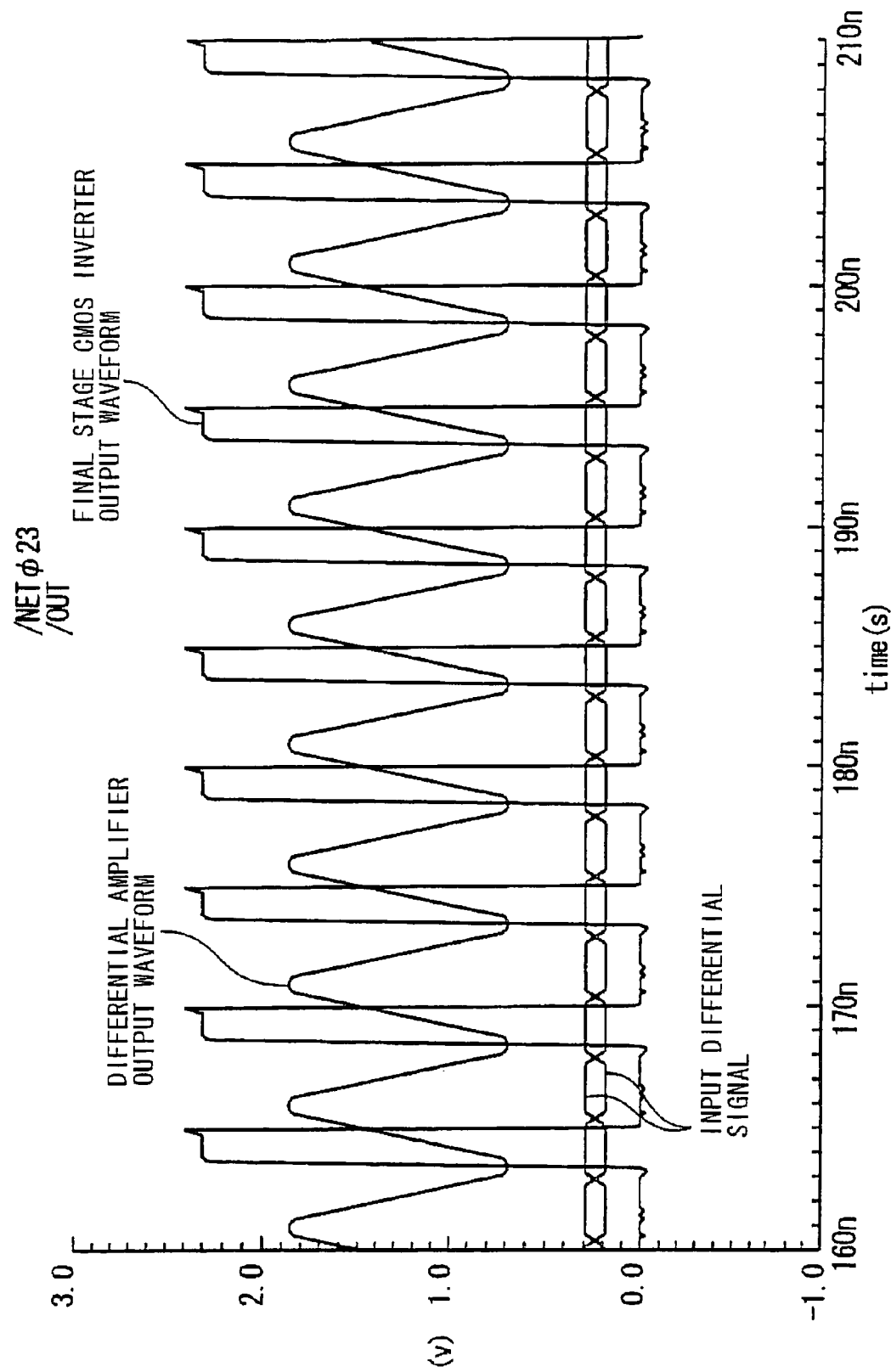

VOLTAGE COMPARATOR CIRCUIT

FIELD OF THE INVENTION

The present invention relates to a differential amplifier and a voltage comparator circuit using the same, especially to a voltage comparator circuit suitable for a high-speed differential interface circuit.

BACKGROUND OF THE INVENTION

In recent years, high-speed differential interface circuits are used in various types of devices. For instance, in the field of TFT_LCD (Thin Film Transistor Liquid Crystal Display), as interfaces between LCD driver LSI and timing controller LSI, RSDS (Reduced Swing Differential Signaling: a registered trademark of National Semiconductor Corporation) and mini-LVDS (mini Low Voltage Differential Signaling: a registered trademark of Texas Instruments, Inc.) are becoming standardized. The voltage comparator circuits with differential inputs are used in the receiver circuits of these technologies.

The frequencies of the differential signal inputted into the voltage comparator circuits are approximately 85 MHz and 200 MHz in the cases of RSDS and mini-LVDS respectively. The input differential voltages of the differential signal component and in-phase signal component are ±50 mV and approximately 0.3V to VDD-0.5V respectively.

A circuit that meets these specifications, as the characteristics required for a voltage comparator circuit, is demanded. However, with the circuit configuration currently available, it is difficult to meet the standards of the in-phase signal component and have a satisfying operation speed simultaneously.

FIG. 6 shows the configuration of a differential amplifier circuit described in Non-Patent Document 1 (IEEE J. Solid-State Circuits. vol. 29 No. 12. December 1994, pp. 1505 to 1513 "A Compact Power-Efficient 3V CMOS Rail-to-Rail Input/Output Operational Amplifier for VLSI Cell Libraries").

In reference to FIG. 6, this differential amplifier comprises a differential amplifier circuit, comprising a first differential pair of a first P-channel MOS transistor MP1 and a second P-channel MOS transistor MP2 and a second differential pair of a first N-channel MOS transistor MN1 and a second N-channel MOS transistor MN2, a third and fourth N-channel MOS transistors MN3 and MN4, connected to a first voltage source V1, wherein their respective gates are connected in common, a third and fourth P-channel MOS transistors MP3 and MP4 wherein their respective gates and sources are connected in common, a fifth and sixth P-channel MOS transistors MP5 and MP6, connected to a second voltage source V2, wherein their respective gates are connected in common, a first constant current source (supplying a current I1) connected between a source connected in common to the first differential pair (MP1 and MP2) and a positive power source VDD, a second constant current source (supplying a current I2) connected between a source connected in common to the second differential pair (MN1 and MN2) and a negative power source, a third constant current source (supplying a current I3) connected between the source of the third N-channel MOS transistor MN3 and the negative power source, and a fourth constant current source (supplying a current I4) connected between the source of the fourth N-channel MOS transistor MN4 and the negative power source.

The drains of the first and second P-channel MOS transistors MP1 and MP2, which constitute the first differential pair, are connected to the sources of the third and fourth N-channel MOS transistors MN3 and MN4 respectively.

The drain of the first N-channel MOS transistor MN1, which constitutes the second differential pair, the drain of the third P-channel MOS transistor MP3, and the source of the fifth P-channel MOS transistor MP5 are connected in common, and the drain of the second N-channel MOS transistor MN2, which constitutes the second differential pair, the drain of the fourth P-channel MOS transistor MP4, and the source of the sixth P-channel MOS transistor MP6 are connected in common.

The gate of the third P-channel MOS transistor MP3, the drain of the fifth P-channel MOS transistor MP5, and the drain of the third N-channel MOS transistor MN3 are connected in common.

The gate of the first N-channel MOS transistor MN1 and the gate of the first P-channel MOS transistor MP1 are connected in common to a noninverting input terminal, and the gate of the second N-channel MOS transistor MN2 and the gate of the second P-channel MOS transistor MP2 are connected in common to an inverting input terminal.

The drain of the sixth P-channel MOS transistor MP6 and the drain of the fourth N-channel MOS transistor MN4 are connected in common to an output terminal.

Voltage comparator circuit is an application of differential amplifier, and the conventional differential amplifier shown in FIG. 6 can be used as a voltage comparator circuit. However, when the differential amplifier shown in FIG. 6 is practically used as a voltage comparator circuit, waveform shaping is necessary.

For the purpose of waveform shaping, CMOS inverters must be connected after this differential amplifier circuit.

FIG. 9 shows a concrete configuration of the above idea. In reference to FIG. 9, the input terminal of a first CMOS inverter INV1 is connected to the output of the differential amplifier. After the first CMOS inverter INV1, second and third CMOS inverters INV2 and INV3 are connected in series for the purpose of further waveform shaping, and the output of the third CMOS inverter INV3 becomes the final output.

FIG. 10 is a drawing showing a concrete example of the circuit configuration of the CMOS inverter shown in FIG. 9. In reference to FIG. 10, the CMOS inverter comprises a P-channel MOS transistor MP1 whose source is connected to a positive power source VDD, an N-channel MOS transistor MN1 whose drain is connected to the drain of the P-channel MOS transistor MP1 and to an output terminal, and source is connected to a negative power source VSS (GND), and the gates of the P-channel MOS transistor MP1 and the N-channel MOS transistor MN1 are connected in common and connected to an input terminal.

Hereinafter, the use of this differential amplifier as a voltage comparator circuit will be analyzed. First, the basic operation of a differential amplifier comprised of MOS transistors is explained with reference to FIGS. 7 and 8. FIG. 7 shows a basic circuit configuration of a differential amplifier circuit, and FIG. 8 shows the direct current transmission characteristics of its input voltage/output current. The sources of N-channel MOS transistors MN1 and MN2 are connected in common, and a constant current source Iss is connected between these sources connected in common and a negative power source. Further, a voltage source $V_{i1}$ is connected to the gate of the MN1, and a voltage source $V_{i2}$ is connected to the gate of the MN2. The following Equation (1) holds because of the relationship of the input voltage, where the gate-source voltages of the MN1 and MN2 are $V_{GS1}$ and $V_{GS2}$ respectively.

$$V_{i1} - V_{GS1} + V_{GS2} - V_{i2} = 0 \quad (1)$$

Furthermore, where the drain currents are $I_{d1}$ and $I_{d2}$ respectively, the gate width and length are W and L respectively, the mobility is μ, the gate oxide film capacity per unit area is $C_o$, and the threshold value is $V_t$, the transconductance β (refer to the following Equation (2)), $V_{GS1}$ and $V_{GS2}$ (the gate-source voltages of the MOS transistors MN1 and MN2) are given by the following Equations (3) and (4).

$$\beta = \frac{W}{L} \mu C_0 \quad (2)$$

$$V_{GS1} = \sqrt{\frac{2I_{d1}}{\beta}} + V_T \quad (3)$$

$$V_{GS2} = \sqrt{\frac{2I_{d2}}{\beta}} + V_T \quad (4)$$

Here, a differential voltage $\Delta V_{id}$ with which the bias current $I_{ss}$ is completely switched to the transistor MN1 is calculated from Equations (1), (3), and (4) as in the following Equation (5).

$$\Delta V_{id} = V_{i1} - V_{i2} = \left( \sqrt{\frac{2I_{ss}}{\beta}} + V_T \right) - V_T = \sqrt{\frac{2I_{ss}}{\beta}} \quad (5)$$

Further, where $V_{GS0}$ is the gate-source voltage $V_{GS}$ when $V_{i1} = V_{i2}$, the drain currents of the MN1 and MN2 become $I_{ss}/2$ respectively and the following Equation (6) is obtained.

$$V_{GS01} = \sqrt{\frac{I_{ss}}{\beta}} + V_T \quad (6)$$

Therefore, the following Equation (7) is given from Equations (5) and (6).

$$\Delta V_{id} = \sqrt{2}(V_{GS0} - V_T) \quad (7)$$

This Equation (7) is a conditional equation for when the MOS differential stage is completely switched. As described above, when the input differential voltage is higher than the value represented by Equation (7), the bias current source of the differential stage flows in one of the transistors and the current of the other transistor becomes zero. This provides a comparator operation.

However, even if it is not switched completely as described above, depending on the structure of a stage after this differential stage, a comparator operation can be obtained with a lower differential voltage than this. It is because this differential stage has enough gain. FIG. 8 shows a relation graph between the input voltage and the drain current, which constitutes the differential stage.

A detailed explanation on the differential amplifier shown in FIG. 6 will be given. The differential amplifier shown in FIG. 6 is a so-called folded cascode-type differential amplifier circuit.

This circuit has the following three operation modes, depending on the input voltage range.

[1] <When Both the First and Second Differential Pairs are Operating>

Where $V_{in}$ is the input voltage $$V_{DD} - (V_{GS(MP1/2)} + V_{DS(sat)(I1)}) > V_{in} > V_{GS(MP1/2)} + V_{DS(sat)(I2)} \quad (8)$$

and where $V_{GS(MN1/2)}$: the gate-source voltages of the N-channel MOS transistors MN 1/2, $V_{DS(sat)(I2)}$: the drain-source voltage of the N-channel MOS transistor, which constitutes the current source I2, at the saturation point (a minimum voltage needed for the operation in the pentode region), $V_{GS(MP1/2)}$: the gate-source voltages of the P-channel MOS transistors MP 1/2, and $V_{DS(sat)(I1)}$: the drain-source voltage of the P-channel MOS transistor, which constitutes a current source I1, at the saturation point (a minimum voltage needed for the operation in the pentode region), and when the above conditions are met, both the first and second differential pairs are in an operating mode.

Assuming a voltage higher than Equation (7) is inputted and it is higher on the side of In+ than that of In−, this circuit operates as a voltage comparator circuit, therefore, all the bias current of the first differential pair (MP1 and MP2) $I_1$ flows to the second P-channel MOS transistor MP2, and the current of the first P-channel MOS transistor MP1 becomes zero. On the other hand, all the bias current of the second differential pair (MN1 and MN2) $I_2$ flows to the first N-channel MOS transistor MN1 and the current of the second N-channel MOS transistor MN2 becomes zero. Looking at the bias current condition of each transistor at this time, the following Equations (9) and (10) hold where $ID_{(MN3)}$ is the drain current of the third N-channel MOS transistor MN3, and $ID_{(MN4)}$ is the drain current of the fourth N-channel MOS transistor MN4:

$$I_{D(MN4)} = I_4 - I_1 \quad (9)$$

$$I_{D(MN3)} = I_3 \quad (10)$$

Here, the relationship of $I_1$, $I_3$, and $I_4$ is as follows:

$$I_3 = I_4 \geq I_1 \quad (11)$$

On the other hand, the fifth P-channel MOS transistor MP5's drain current $I_{D(MP5)}$ is the same as the third N-channel MOS transistor MN3's drain current $ID_{(MN3)}$, therefore the following Equation (12) holds:

$$I_{D(MP5)} = I_{D(MN3)} \quad (12)$$

Furthermore, the third P-channel MOS transistor MP3's drain current $I_{D(MP3)}$ is obtained by adding the fifth P-channel MOS transistor MP5's drain current $I_{D(MP5)}$ and the first N-channel MOS transistor MN1's drain current $I_{D(MN1)}$ $$I_{D(MP5)} = I_3,$$

$$I_{D(MN1)} = I_2,$$

therefore, the following Equation (13) holds:

$$I_{D(MP3)} = I_{D(MP5)} + I_{D(MN1)} = I_3 + I_2 \quad (13)$$

Since the respective gates and sources of the fourth P-channel MOS transistor MP4 and the third P-channel MOS transistor MP3 are connected in common, their drain currents are equal. Therefore, the fourth P-channel MOS transistor MP4's drain current $I_{D(MP4)}$ is given by the following Equation (14):

$$I_{D(MP4)} = I_{D(MP3)} = I_3 + I_2 \quad (14)$$

Further, the value of the sixth P-channel MOS transistor MP6's drain current $I_{D(MP6)}$ is obtained by subtracting the second N-channel MOS transistor MN2's drain current $I_{D(MN2)}$ from the fourth P-channel MOS transistor MP4's drain current $I_{D(MP4)}$, and since $I_{D(MN2)}$ is zero in this condition, $I_{D(MP6)}$ is given by the following Equation (15):

$$I_{D(MP6)}=I_{D(MP4)}-I_{D(MN2)}=I_3+I_2 \qquad (15)$$

Since the drain of the sixth P-channel MOS transistor MP6 and the drain of the fourth N-channel MOS transistor MN4 are connected in common to the output terminal, the output current is the subtraction of Equation (9) from Equation (15) described above ($I_{D(MP6)}-I_{D(MN4)}$). In other words, the output terminal goes to a high level, and the current discharge capability $I_{out}$ is given by the following Equation (16):

$$I_{out}=(I_3+I_2)-(I_4-I_1) \qquad (16)$$

Here, $I_3=I_4$, and as a result, the output end current $I_{out}$ has the current discharge capability of $$I_{out}=I_1+I_2 \qquad (17)$$

and it goes to a high level. Potentially it is a VDD, a nearly positive power source.

Next, assuming a voltage higher than Equation (7) is inputted and it is lower on the side of In$^+$ than that of In$^-$, the present circuit operates as a comparator circuit, therefore, all the bias current of the first differential pair $I_1$ flows to the first P-channel MOS transistor MP1, and the current of the second P-channel MOS transistor MP2 becomes zero. On the other hand, all the bias current of the second differential pair $I_2$ flows to the second N-channel MOS transistor MN2 and the current of the first N-channel MOS transistor MN2 becomes zero. The bias current condition of each transistor at this time can be given by the following Equations (18) and (19) where $I_{D(MN3)}$ is the drain current of the third N-channel MOS transistor MN3, and $I_{D(MN4)}$ is the drain current of the fourth N-channel MOS transistor MN4:

$$I_{D(MN4)}=I_4 \qquad (18)$$

$$I_{D(MN3)}=I_3-I_1 \qquad (19)$$

On the other hand, the fifth P-channel MOS transistor MP5's drain current $I_{D(MP5)}$ is the same as the third N-channel MOS transistor MN3's drain current $I_{D(MN3)}$, therefore it is given by the following Equation (20):

$$I_{D(MP5)}=I_{D(MN3)} \qquad (20)$$

Furthermore, the third P-channel MOS transistor MP3's drain current $I_{D(MP3)}$ is obtained by adding the fifth P-channel MOS transistor MP5's drain current $I_{D(MP5)}$ and the first N-channel MOS transistor MN1's drain current $I_{D(MN1)}$, and in this condition, $I_{D(MP5)}=I_3$, $I_{D(MN1)}=0$, therefore, the following Equation (21) holds:

$$I_{D(MP3)}=I_{D(MP5)}+I_{D(MN1)}=I_3-I_1 \qquad (21)$$

Since the respective gates and sources of the fourth P-channel MOS transistor MP4 and the third P-channel MOS transistor MP3 are connected in common, their drain currents are equal. Therefore, the fourth P-channel MOS transistor MP4's drain current $I_{D(MP4)}$ is given by the following Equation (22):

$$I_{D(MP4)}=I_{D(MP3)}=I_3-I_1 \qquad (22)$$

Further, the value of the sixth P-channel MOS transistor MP6's drain current $I_{D(MP6)}$ is obtained by subtracting the second N-channel MOS transistor MN2's drain current $I_{D(MN2)}$ from the fourth P-channel MOS transistor MP4's drain current $I_{D(MP4)}$, and since $I_{D(MN2)}=I_2$ in this condition, $I_{D(MP6)}$ is given by the following Equation (23):

$$I_{D(MP6)}=I_{D(MP4)}-I_{D(MN2)}=I_3-I_1-I_2 \qquad (23)$$

Similarly, the output current is the subtraction between the current values shown in Equation (18) and Equation (23). In other words, the output end current $I_{out}$ is given by the following Equation (24) where the current discharged from the output end is positive:

$$I_{out}=I_4-(I_3-I_1-I_2) \qquad (24)$$

Here, $I_3=I_4$, and as a result, the output end current $I_{out}$ has a current absorption capability of $$I_{out}=I_1+I_2 \qquad (25)$$

and it goes to a low level. Potentially it becomes 0V, nearly a negative power source (GND).

[2]<When Only the First Differential Pair is Operating>

As opposed to the case in [1], when the input voltage Vin in this case is $$0<V_{in}<V_{GS(MN1/2)}+V_{DS(sat)(I2)} \qquad (26)$$

only the first differential stage operates. It is because the drain-source voltage of the MOS transistor, which functions as the constant current source that constitutes $I_2$, becomes unavailable, therefore, $I_2=0$. As a result, the second differential stage stops operating. A detailed analysis method is omitted here, but if the drive current at the output terminal (OUT) is analyzed as in the case of [1], both the discharge current and absorption current are given by the following Equation (27):

$$I_{out}=I_1 \qquad (27)$$

[3]<When Only the Second Differential Pair is Operating>

As opposed to the case in [1], when the input voltage Vin in this case is $$V_{DD}>V_{in}>V_{DD}-(V_{GS(MP1/2)}+V_{DS(sat)(I1)}) \qquad (29)$$

only the second differential stage operates. It is because the drain-source voltage of the MOS transistor, which functions as the constant current source that constitutes $I_1$, becomes unavailable, therefore, $I_1=0$. As a result, the first differential stage stops operating. A detailed analysis method is omitted here, but if the drive current at the output terminal (OUT) is analyzed as in the case of [1], both the discharge current and absorption current are given by the following Equation (29):

$$I_{out}=I_2 \qquad (29)$$

As becomes clear from the above, the drive capability of the output directly depends on the bias current values of the differential input stage.

Therefore, the only way to increase drive capability is to increase the bias current of the differential stage. This drive current is used for charging/discharging the parasitic capacitance related to the output of the voltage comparator circuit. Therefore, the operation speed depends on this bias current.

As the input frequency increases, the output of the differential amplifier becomes closer to a sinusoidal wave.

Therefore, a CMOS inverter circuit for converting this output sine wave into a rectangular wave, i.e. wave shaping, is connected after this differential amplifier.

Since the threshold of the CMOS inverter is set to approximately VDD/2, the borderline is when the input waveform of the CMOS inverter crosses VDD/2. When the input waveform of the CMOS inverter is below it, the output goes to a high level (VDD), and when it is above it, the output goes to a low level (VSS (GND)). This is how wave shaping is performed. The reason why there are multiple stages of the CMOS inverters (three stages in this case) is because wave shaping cannot be completed by only one stage.

In Patent Document 1, a structure in which the in-phase input voltage range can be as wide as to be from power supply voltage to GND by synthesizing the outputs of a differential amplifier comprising a P-channel MOS transistor and a differential amplifier comprising a N-channel MOS transistor is disclosed.

[Non-Patent Document 1]

IEEE J. Solid-State Circuits. Vol. 29 No. 12. December 1994, pp. 1505-1513, "A Compact Power-Efficient 3V CMOS Rail-to-Rail Input/Output Operational Amplifier for VLSI Cell Libraries."

[Patent Document 1]

Japanese Patent Kokai Publication No. JP-A-03-62712

The entire disclosure of these documents is incorporated herein by reference thereto.

SUMMARY OF THE DISCLOSURE

As described above, in order to have the voltage comparator circuit using the differential amplifier shown in FIG. 7 achieve high-speed operation, the current values of the first through fourth current sources have to be high. As a result, the power consumption will be increased as well.

Also, since the waveform of the output terminal cannot be swung to the full voltage, the N-channel MOS transistor and P-channel MOS transistor of the inverter connected at a later stage of this voltage comparator circuit are turned on simultaneously and a through current flows, resulting in an increase in power consumption.

Further, when the output drive current is increased in order to have the differential amplifier shown in FIG. 7 achieve high-speed operation, since the drive currents are set at the first and second constant current source, their currents I1 and I2 need to be increased. As a result, the power consumption is increased. Further, one of the reasons why the output terminal waveform cannot be swung to the full voltage is because the transistors are vertically stacked.

The differential amplifier shown in FIG. 7 is put into the structure shown in FIG. 9, and the output waveforms (simulation values) with an input differential signal frequency of 200 MHz, a differential amplitude of ±50 mV, and an in-phase signal voltage of 0.3V are shown in FIG. 11.

As shown in FIG. 11, even though the duty of the input differential signal is 50%, the duty of the final output waveform is far from it.

Therefore, there is much to be desired in the art in the light of the above problems i.e., to provide a differential amplifier, with a simple circuit configuration and high-speed operation ability, and a voltage comparator comprising the same.

According to specific features of the present invention, there are provided differential amplifiers and voltage comparators as follows:

A differential amplifier according to an aspect of the present invention comprises: an input differential stage having first and second differential pairs of first and second-conductive types, which are driven by first and second current sources, respectively, and to which a differential input signal is inputted; a folded cascode-type differential stage, which constitutes a load of differential outputs (pair) of the first and second differential pairs, and adds a differential output signal (pair) of the first differential pair and a differential output signal (pair) of the second differential pair, folds and outputs differentially the result; and first and second current mirror circuits of first and second-conductive types, which are disposed oppositely between first and second power sources, receive differential outputs (pair) of the folded cascode-type differential stage into their respective inputs, with their outputs connected in common to an output terminal.

The differential amplifier relating to the present invention can be structured such that the folded cascode-type differential stage includes at least first through third transistor pairs, whose control terminals (gates) are connected to each other, and two current sources between the first and second power sources. The first transistor pair connected to the side of the first power source and the second transistor pair constitute a cascode current mirror circuit. The differential outputs (pair) of the first differential pair are connected respectively to the connection points between the first transistor pair and second transistor pair. The differential outputs (pair) of the second differential pair are connected respectively to connection points between the other ends of the two current sources, whose one end is connected in common to the second power source, and the third transistor pair. One output of the second transistor pair is connected to an input end of the second current mirror circuit, and one output of the third transistor pair is connected to an input end of the first current mirror circuit.

A differential amplifier relating to another aspect of the present invention can be structured as follows. The folded cascode-type differential stage includes at least first through third transistor pairs, whose control terminals (gates) are connected to each other, and two current sources between the first and second power sources. The first transistor pair connected to the side of the second power source and the second transistor pair constitute a cascode current mirror circuit. The differential outputs (pair) of the first differential pair are connected respectively to the connection points between the other ends of the two current sources, whose one end is connected in common to the first power source, and the third transistor pair. The differential outputs (pair) of the second differential pair are connected respectively to the connection points between the first transistor pair and second transistor pair. One output of the second transistor pair is connected to the input end of the first current mirror circuit, and one output of the third transistor pair is connected to the input end of the second current mirror circuit.

A differential amplifier relating to a further aspect of the present invention can be structured as follows. The folded cascode-type differential stage comprises at least a third current mirror circuit, a first transistor pair, whose respective gates are connected to each other, and two current sources between the first and second power sources. The differential outputs (pair) of the first differential pair are connected to the input end of the third current mirror circuit and the input end of the first current mirror circuit respectively. The differential outputs (pair) of the second differential pair are connected to the first transistor pair and the connection points between the two current sources respectively. One output of the first transistor pair is connected to the input end of the second current mirror circuit, and the output of the third current mirror circuit is connected to the input end of the second current mirror circuit.

A voltage comparator relating to a further aspect of the present invention comprises a wave shaping circuit at the output stage of the differential amplifier described above. The wave shaping circuit is constituted by inverters or buffer circuits.

The meritorious effects of the present invention are summarized as follows.

According to the present invention, high-speed operation is achieved by a simple structure comprising an input differential stage, a folded cascode differential stage, and first and second current mirror circuits disposed oppositely between power sources.

According to the present invention, high-speed operation is made possible by having the first and second current mirror circuits with a current amplification function and increasing the driving ability as a result.

According to the present invention, a buffer circuit is provided after the output of the differential amplifier for the purpose of wave shaping, and the output of the buffer circuit becomes the output of the voltage comparator.

BRIEF DESCRIPTION OF THE DRAWINGS

FIG. 11 is a drawing showing simulated input/output waveforms of the conventional example.

PREFERRED EMBODIMENTS OF THE INVENTION

Preferred embodiments of the present invention will be explained hereinafter with reference to drawings. The present invention comprises an input differential stage, which inputs a differential input signal and has a first and second differential pairs with reverse polarity to each other, a folded cascode-type differential stage, which is connected to the differential output of the input differential stage and adds a differential output signal of the first differential pair and a differential output signal of the second differential pair, a first and second current mirror circuits (CM1 and CM2) with reverse polarity to each other, which are disposed between the power supplies to face each other, receive the differential output of the folded cascode-type differential stage with their respective inputs, and whose outputs are connected in common to the output terminal. The folded cascode-type differential stage, which receives the output voltage (differential output) of the input differential stage and provides a folded current output, adds a differential output signal of the first differential pair and a differential output signal of the second differential pair, and the output of the folded cascode-type differential stage is folded and outputted from the output terminal by the first and second current mirror circuits. By having the first and second current mirror circuits with a current amplification function, the driving ability is increased and high-speed operation can be achieved. According to the present invention, multiple inverters (or buffer circuits) as a wave shaping circuit are provided after the output of the differential amplifier, and an output of the wave shaping circuit becomes a resultant output of the voltage comparator. A detailed explanation on the embodiments is given hereinafter.

Embodiment

Figure 1:
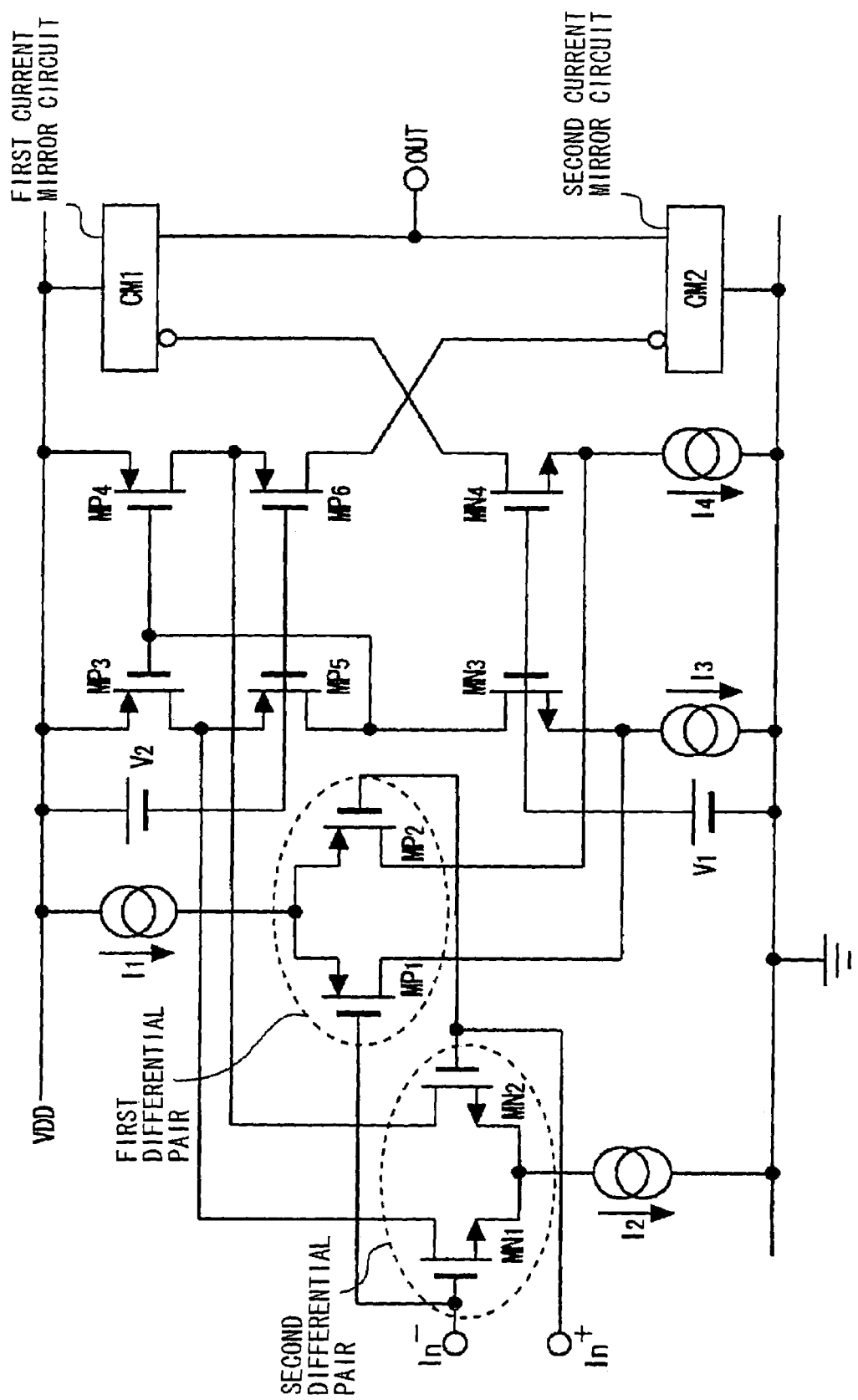
FIG. 1 is a drawing showing the circuit configuration of a differential amplifier of a first embodiment according to the present invention.

FIG. 1 is a drawing showing an equivalent circuit of a differential amplifier of a first embodiment according to the present invention. It is a differential amplifier used in a voltage comparator circuit with a noninverting input and an inverting input. In reference to FIG. 1, the differential amplifier of the first embodiment comprises a first differential pair of a first P-channel MOS transistor MP1 and a second P-channel MOS transistor MP2 with their sources connected in common, a second differential pair of a first N-channel MOS transistor MN1 and a second N-channel MOS transistor MN2 with their sources connected in common, third and fourth N-channel MOS transistors MN3 and MN4 with their gates connected in common to a first voltage source (V1), third and fourth P-channel MOS transistors MP3 and MP4 with their gate connected in common and their sources connected in common to a positive power source (VDD), a fifth and sixth P-channel MOS transistors MP5 and MP6 with their gate connected in common to a second voltage source (V2), a first current mirror circuit CM1 with its input connected to the drain of the fourth N-channel MOS transistor MN4 and its common terminal connected to the positive power source VDD, a second current mirror circuit CM2 with its input connected to the drain of the sixth P-channel MOS transistor MP6 and its common terminal connected to a negative power source terminal (GND), a first constant current source (I1) connected between the commonly connected sources of the P-channel MOS transistors MP1 and MP2, which constitute the first differential pair, and the positive power source VDD, a second constant current source (I2) connected between the commonly connected sources of the N-channel MOS transistors MN1 and MN2, which constitute the second differential pair, and the negative power source (GND), a third constant current source (I3) connected between the source of the third N-channel MOS transistor MN3 and the negative power source (GND), and a fourth constant current source (I4) connected between the source of the fourth N-channel MOS transistor MN4 and the negative power source (GND).

The drain of the first P-channel MOS transistor MP1, which constitutes the first differential pair, is connected to the source of the third N-channel MOS transistor MN3, and the drain of the second P-channel MOS transistor MP2, which constitutes the first differential pair, is connected to the source of the fourth N-channel MOS transistor MN4.

The drain of the first N-channel MOS transistor MN1, which constitutes the second differential pair, the drain of the third P-channel MOS transistor MP3, and the source of the fifth P-channel MOS transistor MP5 are connected in common. The drain of the second N-channel MOS transistor MN2, which constitutes the second differential pair, the drain of the fourth P-channel MOS transistor MP4, and the source of the sixth P-channel MOS transistor MP6 are connected in common, the gate of the third P-channel MOS transistor MP3, the drain of the fifth P-channel MOS transistor MP5, and the drain of the third N-channel MOS transistor MN3 are connected in common. The output of the first current mirror circuit CM1 and the output of the second current mirror circuit CM2 are connected in common to an output terminal OUT. The gate of the first P-channel MOS transistor MP1 and the gate of the first N-channel MOS transistor MN1 are connected in common to an inverting input terminal In⁻. The gate of the second P-channel MOS transistor MP2 and the gate of the second N-channel MOS transistor MN2 are connected in common to a noninverting input terminal In⁺. CMOS inverter circuits (not shown in the drawing) connected in multiple stages to the output OUT of the differential amplifier circuit are connected, and the output of a final stage CMOS inverter becomes the final output of the voltage comparator circuit. Here, the first and second current mirror circuits CM1 and CM2 have an input to output current ratio of 1:k (k>1).

Figure 4A:
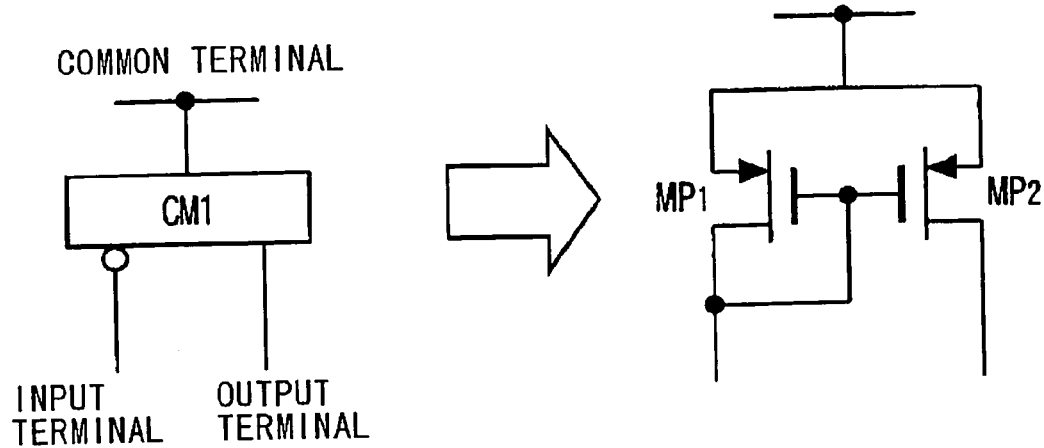
FIGS. 4A and 4B are drawings showing structural examples of the current mirror circuits shown in FIGS. 1, 2, and 3.
Figure 4B:
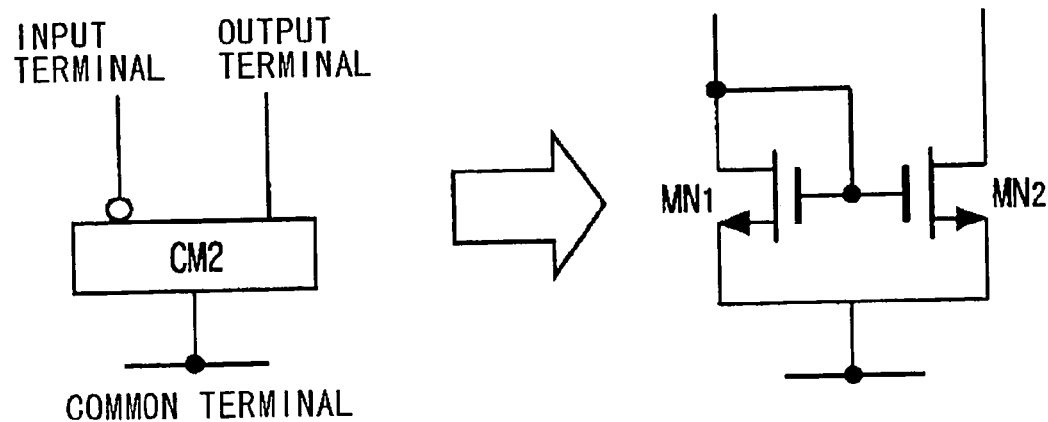

Concrete examples of the configuration of the current mirror circuit will be described. FIGS. 4A and 4B show structural examples of the first current mirror circuit CM1 (current discharge type) and the second current mirror circuit CM2 (current absorption type) shown in FIG. 1. In reference to FIG. 4A, the first current mirror circuit CM1 shown in FIG. 1 is constituted by two P-channel MOS transistors MP1 and MP2, and their respective sources and gates are connected in common. The gate and drain of the P-channel MOS transistor MP1 are connected in common to an input terminal of the current mirror circuit CM1, and the drain of the P-channel MOS transistor MP2 becomes the output terminal of the current mirror circuit CM1. The commonly connected sources become a common terminal of the current mirror circuit.

Next, in reference to FIG. 4B, the second current mirror circuit CM2 shown in FIG. 1 is constituted by two N-channel MOS transistors MN1 and MN2, and their respective sources and gates are connected in common. The gate and drain of the N-channel MOS transistor MN1 are connected in common to an input terminal of the current mirror circuit, and the drain of the N-channel MOS transistor MN2 becomes the output terminal of the current mirror circuit CM2. The commonly connected sources become a common terminal of the current mirror circuit CM2.

Next, a structural example of a voltage comparator circuit using the differential amplifier shown in FIG. 1 will be shown. As in the conventional example shown in FIG. 9, CMOS inverters (FIG. 10) are cascode-connected in three stages after the differential amplifier circuit.

A detailed explanation on the differential amplifier shown in FIG. 1 will be given. This differential amplifier is an application of so-called folded cascode-type differential amplifier. Here, the operation of this circuit will be explained.

<When Both the First and Second Differential Pairs are Operating>

Assuming a voltage higher on the side of In⁻ than that of In⁺ is inputted and it is a differential input voltage higher than indicated in Equation (7), the differential amplifier shown in FIG. 1 operates as a comparator circuit, therefore, all the bias current of the first differential pair $I_1$ flows to the second P-channel MOS transistor MP2. The current of the first P-channel MOS transistor MP1 becomes zero. On the other hand, all the bias current of the second differential pair $I_2$ flows to the first N-channel MOS transistor MN1 and the current of the second N-channel MOS transistor MN2 becomes zero. Looking at the bias current condition of each transistor at this time, the following Equations (30) and (31) hold where $I_{D(MN3)}$ is the drain current of the third N-channel MOS transistor MN3 and $I_{D(MN4)}$ is the drain current of the fourth N-channel MOS transistor MN4, since the fourth N-channel MOS transistor MN4's drain current $I_{D(MN4)}$ is the subtraction of a second P-channel MOS transistor MP2's drain current $I_{D(MP2)}$ from a current source $I_4$ and the third N-channel MOS transistor MN3's drain current $I_{D(MN3)}$ is the subtraction of a first P-channel MOS transistor MP1's drain current $I_{D(MP1)}$ from a current source $I_3$:

$$I_{D(MN4)}=I_4-I_{D(MP2)}=I_4-I_1 \tag{30}$$

$$I_{D(MN3)}=I_3-I_{D(MP1)}=I_3 \tag{31}$$

Here, the relationship among I1, I3, and I4 is as follows:

$$I_3=I_4 \geq I_1 \tag{32}$$

On the other hand, since a fifth P-channel MOS transistor MP5's drain current $I_{D(MP5)}$ is equal to the third N-channel MOS transistor MN3's drain current $I_{D(MN3)}$, the following equation holds:

$$I_{D(MP5)}=I_{D(MN3)} \tag{33}$$

Further, a third P-channel MOS transistor MP3's drain current $I_{D(MP3)}$ is the addition of the fifth P-channel MOS transistor MP5's drain current $I_{D(MP5)}$ and a first N-channel MOS transistor MN1's drain current $I_{D(MN1)}$, and $I_{D(MP5)}=I_3$, $I_{D(MN1)}=I_2$, therefore, the following equation holds:

$$I_{D(MP3)}=I_{D(MP5)}+I_{D(MN1)}=I_3+I_2 \tag{34}$$

Because the respective gates and sources of the fourth P-channel MOS transistor MP4 and the third P-channel MOS transistor MP3 are connected in common, their drain currents are equal. Therefore, a fourth P-channel MOS transistor MP4's drain current $I_{D(MP4)}$ is given by the following equation:

$$I_{D(MP4)}=I_{D(MP3)}=I_3+I_2 \tag{35}$$

Further, since a sixth P-channel MOS transistor MP6's drain current $I_{D(MP6)}$ is the subtraction of a second N-channel MOS transistor MN2's drain current $I_{D(MN2)}$ from the fourth P-channel MOS transistor MP4's drain current $I_{D(MP4)}$, and $I_{D(MN2)}$ is zero in this condition, it is given by the following equation:

$$I_{D(MP6)}=I_{D(MP4)}-I_{D(MN2)}=I_3+I_2 \tag{36}$$

The currents indicated in Equations (30) and (36) are the input currents of the first and second current mirror circuits CM1 and CM2 respectively. The input to output current ratio of the first and second current mirror circuits CM1 and CM2 can be given by the following equation:

$$\text{Input current:output current}=1:k \tag{37}$$

Here, assuming k>1, an output end current $I_{out}$ is the addition of the output currents of the first and second current mirror circuits, therefore, it is given by the following Equation (38), assuming the current flowing into the output end is positive:

$$I_{out}=k(I_3+I_2)-k(I_4-I_1) \tag{38}$$

Here, $I_3=I_4$, and as a result, the output end current $I_{out}$ has a current absorption capability indicated in the following equation and goes to a low level:

$$I_{out}=k(I_1+I_2) \tag{39}$$

Potentially it becomes 0V, a nearly negative power source (GND).

Assuming a voltage lower on the side of In⁻ than that of In⁺ is inputted, the circuit shown in FIG. 1 operates as a comparator circuit, therefore, all the bias current of the first differential pair $I_1$ flows to the first P-channel MOS transistor MP1. The current of the second P-channel MOS transistor MP2 becomes zero. On the other hand, all the bias current of the second differential pair $I_2$ flows to the second N-channel MOS transistor MN2 and the current of the first N-channel MOS transistor MN1 becomes zero. Looking at the bias current condition of each transistor at this time, $I_{D(MN3)}$, the drain current of the third N-channel MOS transistor MN3, and $I_{D(MN4)}$, the drain current of the fourth N-channel MOS transistor MN4, are given by the following Equations (40) and (41) respectively:

$$I_{D(MN4)}=I_4-I_{D(MP2)}=I_4 \qquad (40)$$

$$I_{D(MN3)}=I_3-I_{D(MP1)}=I_3-I_1 \qquad (41)$$

On the other hand, since a fifth P-channel MOS transistor MP5's drain current $I_{D(MP5)}$ is equal to the third N-channel MOS transistor MN3's drain current $I_{D(MN3)}$, the following Equation (42) holds:

$$I_{D(MP5)}=I_{D(MN3)} \qquad (42)$$

Further, a third P-channel MOS transistor MP3's drain current $I_{D(MP3)}$ is the addition of the fifth P-channel MOS transistor MP5's drain current $I_{D(MP5)}$ and a first N-channel MOS transistor MN1's drain current $I_{D(MN1)}$, and $I_{D(MP5)}$ $=I_3-I_1$, $I_{D(MN1)}=0$ in this condition, therefore, the following Equation (43) holds:

$$I_{D(MP3)}=I_{D(MP5)}+I_{D(MN1)}=I_3-I_1 \qquad (43)$$

Because the respective gates and sources of the fourth P-channel MOS transistor MP4 and the third P-channel MOS transistor MP3 are connected in common, their drain currents are equal. Therefore, a fourth P-channel MOS transistor MP4's drain current $I_{D(MP4)}$ is similarly given by the following equation (44):

$$I_{D(MP4)}=I_{D(MP3)}=I_3-I_1 \qquad (44)$$

Further, since a sixth P-channel MOS transistor MP6's drain current $I_{D(MP6)}$ is the subtraction of a second N-channel MOS transistor MN2's drain current $I_{D(MN2)}$ from the fourth P-channel MOS transistor MP4's drain current $I_{D(MP4)}$, and $I_{D(MN2)}$ is $I_2$ in this condition, it is given by the following equation:

$$I_{D(MP6)}=I_{D(MP4)}-I_{D(MN2)}=I_3-I_1-I_2 \qquad (45)$$

The currents indicated in Equations (40) and (45) are the input currents of the first and second current mirror circuits CM1 and CM2 respectively.

Therefore, an output end current $I_{out}$ is given by the following Equation (46), assuming the current discharged from the output end is positive:

$$I_{out}=kI_4-k(I_3-I_1-I_2) \qquad (46)$$

Here, $I_3=I_4$, and as a result, the output end current $I_{out}$ has a current discharge capability indicated in the following Equation (47) and goes to a high level:

$$I_{out}=k(I_1+I_2) \qquad (47)$$

Potentially it becomes a nearly positive power source VDD.

As indicated in Equations (39) and (47), the current absorption capability at the time of a low level and the current discharge capability at the time of a high level have the same current value, therefore, even in the case where the load has a parasitic capacitance, a rising waveform and a falling waveform are symmetrical and a digital waveform obtained by waveform-shaping these waveforms can have an output with a duty ratio of 50%.

Above explanations relate to the case where the differential pair of the N-channel transistors and the differential pair of the P-channel transistors are both operating. When the in-phase signal voltage of the input differential signal decreases, the differential pair of the N-channel stops operating. On the other hand, when the in-phase signal voltage of the input differential signal increases, the differential pair of the P-channel stops operating. Hereinafter, the operation at this time will be explained.

<When Only the First Differential Pair is Operating>

In FIG. 1, the current source I2, which biases the N-channel differential stage, is normally constituted by N-channel MOS transistors. At this time, the minimum input voltage $V_{in(min.)}$ required for the normal operation of the N-channel differential stage is given by the following Equation (48):

$$V_{in(min.)}=V_{GS(MN1/2)}+V_{DS(sat)(I2)} \qquad (48)$$

$V_{GS(MN1/2)}$: the gate-source voltages of the N-channel MOS transistors MN 1/2, $V_{DS(sat)(I2)}$: the drain-source voltage of the N-channel MOS transistor, which constitutes the current source $I_2$, at the saturation point (a minimum voltage required for the operation in the pentode region).

When the input voltage is lower than this $V_{in(min.)}$, the N-channel transistor differential pair does not operate. Therefore, only the P-channel transistor differential pair operates. Under this condition, assuming a voltage higher on the side of In than that of In⁺ is inputted, all the bias current of the first differential pair $I_1$ flows to the second P-channel MOS transistor MP2. The current of the first P-channel MOS transistor MP1 becomes zero. On the other hand, the second differential pair does not operate since it is out of the input voltage range. In other words, the both drain currents of the first N-channel MOS transistor MN1 and the second N-channel MOS transistor MN2 become zero.

Looking at the bias current condition of each transistor at this time, $I_{D(MN3)}$, the drain current of the third N-channel MOS transistor MN3, and $I_{D(MN4)}$, the drain current of the fourth N-channel MOS transistor MN4, are given by the following Equations (49) and (50) respectively:

$$I_{D(MN4)}=I_4-I_1 \qquad (49)$$

$$I_{D(MN3)}=I_3 \qquad (50)$$

On the other hand, since a fifth P-channel MOS transistor MP5's drain current $I_{D(MP5)}$ is equal to the third N-channel MOS transistor MN3's drain current $I_{D(MN3)}$, it is given by the following Equation (51):

$$I_{D(MP5)}=I_{D(MN3)} \qquad (51)$$

Further, a third P-channel MOS transistor MP3's drain current $I_{D(MP3)}$ is the addition of the fifth P-channel MOS transistor MP5's drain current $I_{D(MP5)}$ and a first N-channel MOS transistor MN1's drain current $I_{D(MN1)}$, and $I_{D(MN1)}=0$ in this condition, therefore, the following Equation (52) holds:

$$I_{D(MP3)}=I_{D(MP5)}=I_3 \qquad (52)$$

Because the respective gates and sources of the fourth P-channel MOS transistor MP4 and the third P-channel MOS transistor MP3 are connected in common, their drain currents are equal. Therefore, a fourth P-channel MOS transistor MP4's drain, current $I_{D(MP4)}$ is given by the following Equation (53):

$$I_{D(MP4)}=I_{D(MP3)}=I_3 \qquad (53)$$

Further, since a sixth P-channel MOS transistor MP6's drain current $I_{D(MP6)}$ is the subtraction of a second N-channel MOS transistor MN2's drain current $I_{D(MN2)}$ from the fourth P-channel MOS transistor MP4's drain current $I_{D(MP4)}$, and $I_{D(MN2)}$ is zero in this condition, the following Equation (54) holds:

$$I_{D(MP6)} = I_{D(MP4)} - I_{D(MN2)} = I_3 \quad (54)$$

Therefore, the output terminal OUT goes to a low level, and a current absorption capability $I_{out}$ can be given by the following Equation (55):

$$I_{out} = kI_3 - k(I_4 - I_1) = kI_1 \quad (55)$$

Next, assuming a voltage lower on the side of In⁻ than that of In⁺ is inputted, this circuit operates as a comparator circuit, therefore, all the bias current of the first differential pair $I_1$ flows to the first P-channel MOS transistor MP1. The current of the second P-channel MOS transistor MP2 becomes zero. On the other hand, the second differential pair does not operate since it is out of the input voltage range. In other words, the both drain currents of the first N-channel MOS transistor MN1 and the second N-channel MOS transistor MN2 become zero. Looking at the bias current condition of each transistor at this time, $I_{D(MN3)}$, the drain current of the third N-channel MOS transistor MN3, and $I_{D(MN4)}$, the drain current of the fourth N-channel MOS transistor MN4, are given by the following Equations (56) and (57) respectively:

$$I_{D(MN4)} = I_4 - I_{D(MP2)} = I_4 \quad (56)$$

$$I_{D(MN3)} = I_3 - I_{D(MP1)} = I_3 - I_1 \quad (57)$$

On the other hand, since a fifth P-channel MOS transistor MP5's drain current $I_{D(MP5)}$ is equal to the third N-channel MOS transistor MN3's drain current $I_{D(MN3)}$, it is given by the following Equation (58):

$$I_{D(MP5)} = I_{D(MN3)} \quad (58)$$

Further, a third P-channel MOS transistor MP3's drain current $I_{D(MP3)}$ is the addition of the fifth P-channel MOS transistor MP5's drain current $I_{D(MP5)}$ and a first N-channel MOS transistor MN1's drain current $I_{D(MN1)}$, and $I_{D(MN1)} = 0$ in this condition, therefore, it is given by the following equation:

$$I_{D(MP3)} = I_{D(MP5)} = I_3 - I_1 \quad (59)$$

Because the respective gates and sources of the fourth P-channel MOS transistor MP4 and the third P-channel MOS transistor MP3 are connected in common, their drain currents are equal. Therefore, a fourth P-channel MOS transistor MP4's drain current $I_{D(MP4)}$ is given by the following Equation (60):

$$I_{D(MP4)} = I_{D(MP3)} = I_3 - I_1 \quad (60)$$

Further, since a sixth P-channel MOS transistor MP6's drain current $I_{D(MP6)}$ is the subtraction of a second N-channel MOS transistor MN2's drain current $I_{D(MN2)}$ from the fourth P-channel MOS transistor MP4's drain current $I_{D(MP4)}$, and $I_{D(MN2)}$ is zero in this condition, $I_{D(MP6)}$ can be given by the following Equation (61):

$$I_{D(MP6)} = I_{D(MP4)} - I_{D(MN2)} = I_3 - I_1 \quad (61)$$

Therefore, the output terminal OUT goes to a high level at this time, and a current discharge capability $I_{OUT}$ is given by the following Equation (62):

$$I_{out} = kI_4 - k(I_3 - I_1) = kI_1 \quad (62)$$

<When Only the Second Differential Pair is Operating>

In FIG. 1, the current source $I_1$, which biases the P-channel differential pair, is normally constituted by P-channel MOS transistors. At this time, the maximum input voltage $V_{in(max.)}$ required for the normal operation of the P-channel differential stage is given by the following Equation (63):

$$V_{in(max.)} = V_{DD} - V_{GD(MP1/2)} + V_{DS(sat)(I1)} \quad (63)$$

$V_{GS(MP1/2)}$: the gate-source voltages of the P-channel MOS transistors MP 1/2, $V_{DS(sat)(I1)}$: the drain-source voltage of the P-channel MOS transistor, which constitutes the current source $I_1$, at the saturation point (a minimum voltage required for the operation in the pentode region).

When the input voltage is higher than this $V_{in(max.)}$, the P-channel MOS transistor differential pair does not operate. Therefore, only the N-channel transistor differential pair operates. Under this condition, assuming a voltage higher on the side of In⁻ than that of In⁺ is inputted, all the bias current of the second differential pair $I_2$ flows to the first N-channel MOS transistor MN1. The current of the second N-channel MOS transistor MN1 becomes zero. On the other hand, the first differential pair does not operate since it is out of the input voltage range. In other words, the both drain currents of the first P-channel MOS transistor MP1 and the second P-channel MOS transistor MP2 become zero. Looking at the bias current condition of each transistor at this time, the following Equations (64) and (65) hold where $I_{D(MN3)}$ is the drain current of the third N-channel MOS transistor MN3 and $I_{D(MN4)}$ is the drain current of the fourth N-channel MOS transistor MN4:

$$I_{D(MN4)} = I_4 - I_{D(MP2)} = I_4 \quad (64)$$

$$I_{D(MN3)} = I_3 - I_{D(MP1)} = I_3 \quad (65)$$

On the other hand, since a fifth P-channel MOS transistor MP5's drain current $I_{D(MP5)}$ is equal to the third N-channel MOS transistor MN3's drain current $I_{D(MN3)}$, the following Equation (66) holds:

$$I_{D(MP5)} = I_{D(MN3)} \quad (66)$$

Further, a third P-channel MOS transistor MP3's drain current $I_{D(MP3)}$ is the addition of the fifth P-channel MOS transistor MP5's drain current $I_{D(MP5)}$ and a first N-channel MOS transistor MN1's drain current $I_{D(MN1)}$, and $I_{D(MN1)} = I_2$ in this condition, therefore, the following Equation (67) holds:

$$I_{D(MP3)} = I_{D(MP5)} + I_{D(MN1)} = I_3 + I_2 \quad (67)$$

Because the respective gates and sources of the fourth P-channel MOS transistor MP4 and the third P-channel MOS transistor MP3 are connected in common, their drain currents are equal. Therefore, a fourth P-channel MOS transistor MP4's drain current $I_{D(MP4)}$ is given by the following Equation (68):

$$I_{D(MP4)} = I_{D(MP3)} = I_3 + I_2 \quad (68)$$

Further, since a sixth P-channel MOS transistor MP6's drain current $I_{D(MP6)}$ is the subtraction of a second N-channel MOS transistor MN2's drain current $I_{D(MN2)}$ from the fourth P-channel MOS transistor MP4's drain current $I_{D(MP4)}$, and $I_{D(MN2)}$ is zero in this condition, the following Equation (69) holds:

$$I_{D(MP6)} = I_{D(MP4)} - I_{D(MN2)} = I_3 + I_2 \quad (69)$$

Therefore, the output terminal OUT goes to a low level. Since the input to output current ratio of the first and second current mirror circuits is 1:k, a current absorption capability $I_{out}$ is given by the following Equation (70):

$$I_{out}=k(I_3+I_2)-kI_4=kI_2 \quad (70)$$

Next, assuming a voltage lower on the side of In⁻ than that of In⁺ is inputted, the circuit of the present embodiment operates as a comparator circuit, therefore, all the bias current of the second differential pair $I_2$ flows to the second N-channel MOS transistor MN2. The current of the first N-channel MOS transistor MN1 becomes zero. On the other hand, the first differential pair does not operate since it is out of the input voltage range. In other words, the both drain currents of the first P-channel MOS transistor MP1 and the second P-channel MOS transistor MP2 become zero. Looking at the bias current condition of each transistor at this time, $I_{D(MN3)}$, the drain current of the third N-channel MOS transistor MN3, and $I_{D(MN4)}$, the drain current of the fourth N-channel MOS transistor MN4, are given by the following Equations (71) and (72):

$$I_{d(MN4)}=I_4-I_{D(MP2)}=I_4 \quad (71)$$

$$I_{D(MN3)}=I_3-I_{D(MP1)}=I_3 \quad (72)$$

On the other hand, since a fifth P-channel MOS transistor MP5's drain current $I_{D(MP5)}$ is equal to the third N-channel MOS transistor MN3's drain current ID(MN3), the following Equation (73) holds:

$$I_{D(MP5)}=I_{D(MN3)} \quad (73)$$

Further, a third P-channel MOS transistor MP3's drain current $I_{D(MP3)}$ is the addition of the fifth P-channel MOS transistor MP5's drain current $I_{D(MP5)}$ and a first N-channel MOS transistor MN1's drain current $I_{D(MN1)}$, and $I_{D(MN1)}=0$ in this condition, therefore, the following Equation (74) holds:

$$I_{D(MP3)}=I_{D(MP5)}=I_3 \quad (74)$$

Because the respective gates and sources of the fourth P-channel MOS transistor MP4 and the third P-channel MOS transistor MP3 are connected in common, their drain currents are equal. Therefore, a fourth P-channel MOS transistor MP4's drain current $I_{D(MP4)}$ is given by the following Equation (75):

$$I_{D(MP4)}=I_{D(MP3)}=I_3 \quad (75)$$

Further, since a sixth P-channel MOS transistor MP6's drain current $I_{D(MP6)}$ is the subtraction of a second N-channel MOS transistor MN2's drain current $I_{D(MN2)}$ from the fourth P-channel MOS transistor MP4's drain current $I_{D(MP4)}$, and $I_{D(MN2)}=I_2$ in this condition, $I_{D(MP6)}$ can be given by the following Equation (76):

$$I_{D(MP6)}=I_{D(MP4)}-I_{D(MN2)}=I_3-I_2 \quad (76)$$

Therefore, the output terminal OUT goes to a high level at this time, and a current discharge capability $I_{OUT}$ is given by the following Equation (77):

$$I_{out}=kI_4-k(I_3-I_2)=kI_2 \quad (77)$$

Next, an explanation on the operation of the current mirror circuit shown in FIG. 4 will be given. For instance, the following Equation (78) holds where $W_{MP1}$ and $W_{MP2}$ are the gate widths of the first and second P-channel MOS transistors MP1 and MP2 respectively, and $L_{MP1}$ and $L_{MP2}$ are the gate lengths:

$$\frac{W_{MP1}}{L_{MP1}}:\frac{W_{MP2}}{L_{MP2}} = 1:k \quad (78)$$

The relationship between an input current $I_{in}$ and the output current $I_{out}$ of the current mirror circuit is given by the following Equation (79):

$$I_{out}=kI_{in} \quad (79)$$

As becomes clear by looking at Equations (2), (3), and (4) that shows the relationships between the gate-source voltage of the MOS transistor and a drain current $I_d$, the drain current is proportional to W/L.

Figure 2:
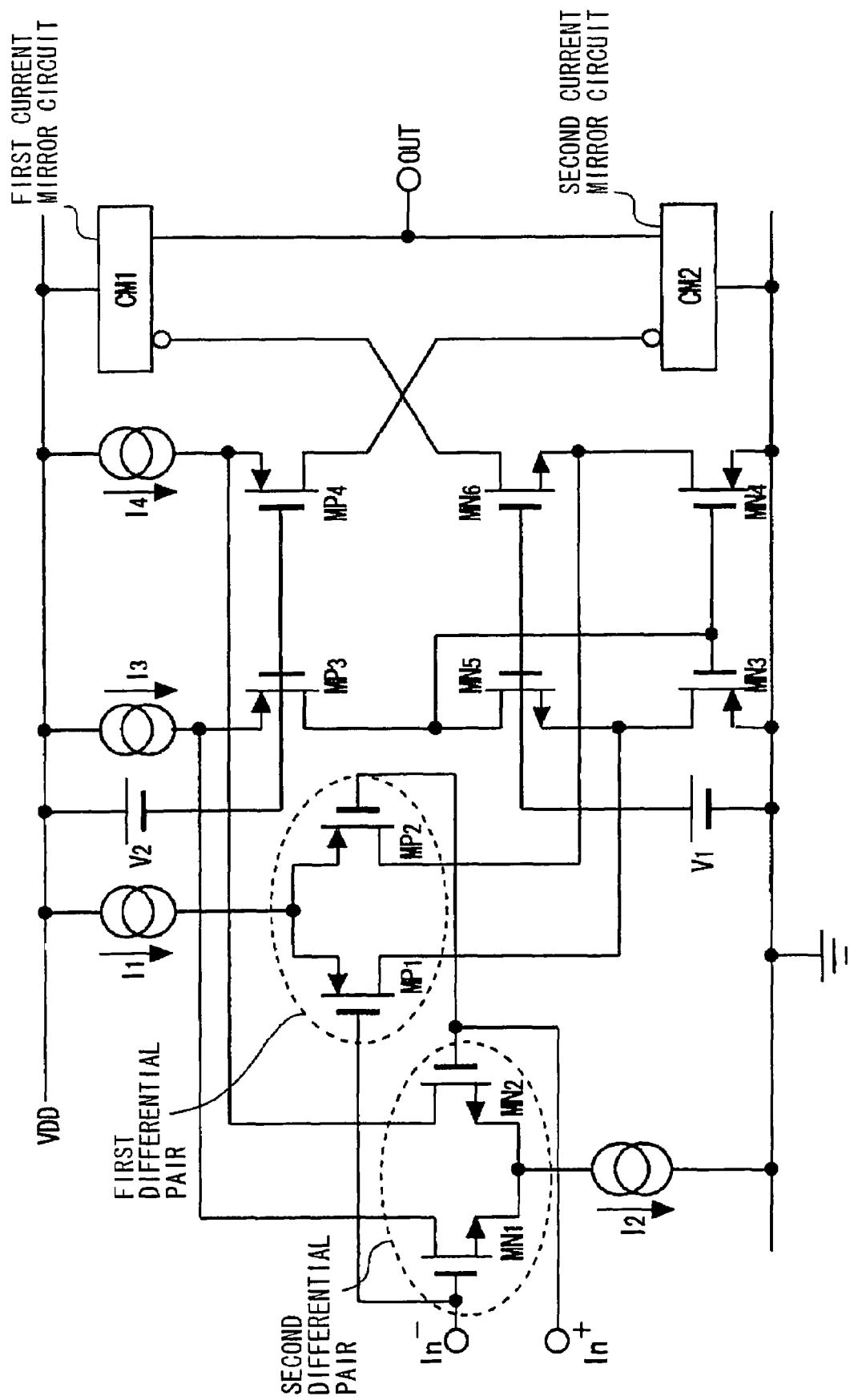
FIG. 2 is a drawing showing the circuit configuration of a differential amplifier of a second embodiment.
Figure 7:
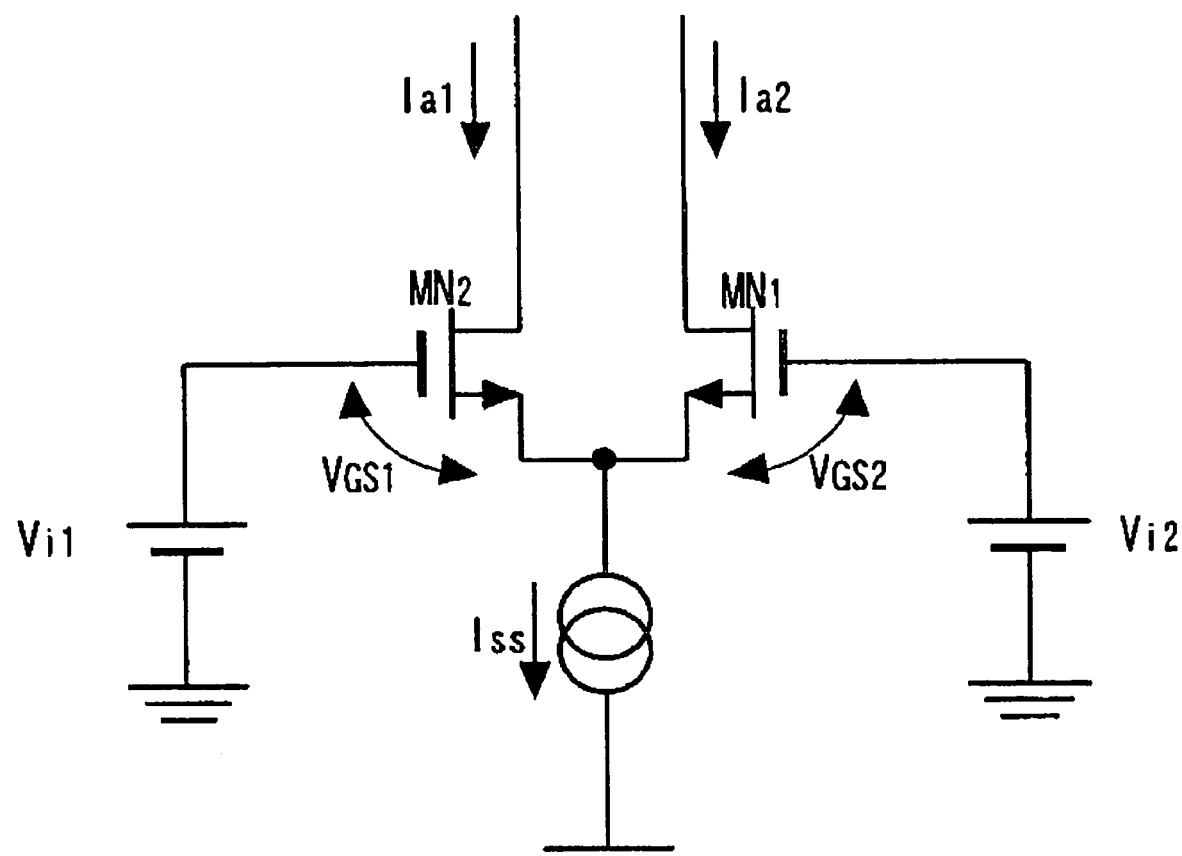
FIG. 7 is a drawing showing the circuit configuration of a conventional differential amplifier stage.
Figure 8:
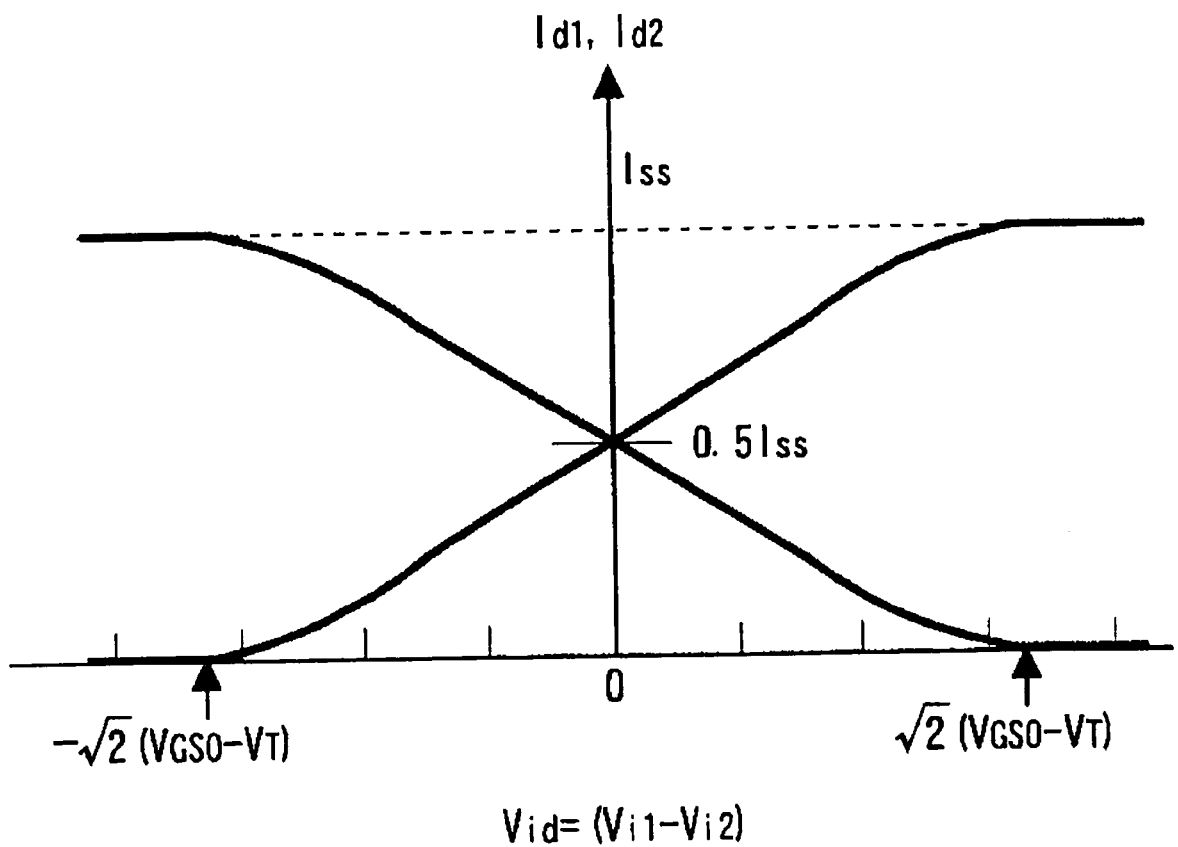
FIG. 8 is a drawing showing the input/output characteristics of the differential amplifier stage shown in FIG. 7.

FIG. 2 is a drawing showing the configuration of a differential amplifier of a second embodiment according to the present invention. In the configuration shown in FIG. 2, the P-channel MOS transistors MP3 and MP4 in FIG. 1 become N-channel MOS transistors MN3 and MN4 respectively, the P-channel MOS transistors MP5 and MP6 in FIG. 1 become N-channel MOS transistors MN5 and MN6, the absorption-type current sources I3 and I4, and the N-channel MOS transistors MN3 and MN4 in FIG. 7 become discharge type current sources I3 and I4, and P-channel MOS transistors MP3 and MP4 respectively, and it is configured so that the polarity is symmetrical to the one in FIG. 1.

In reference to FIG. 2, the differential amplifier of the second embodiment comprises a first differential pair of a first P-channel MOS transistor MP1 and a second P-channel MOS transistor MP2, a second differential pair of a first N-channel MOS transistor MN1 and a second N-channel MOS transistor MN2, a third and fourth N-channel MOS transistors MN3 and MN4 with their respective gates and sources connected in common, a fifth and sixth N-channel MOS transistors MN5 and MN6 with their gates connected in common to a first voltage source, a third and fourth P-channel MOS transistors MP3 and MP4 with their gate connected in common to a second voltage source, a first current mirror circuit CM1 with its input connected to the drain of the sixth N-channel MOS transistor MN6 and its common terminal connected to the positive power source VDD, a second current mirror circuit CM2 with its input connected to the drain of the fourth P-channel MOS transistor MP4 and its common terminal connected to a negative power source terminal (GND), a first constant current source (I1) connected between the sources connected in common to the first differential pair and the positive power source VDD, a second constant current source (I2) connected between the sources connected in common to the second differential pair and the negative power source (GND), a third constant current source (I3) connected between the source of the third P-channel MOS transistor MP3 and the positive power source (VDD), and a fourth constant current source (I4) connected between the source of the fourth P-channel MOS transistor MP4 and the positive power source (VDD), and the drain of the first P-channel MOS transistor MP1, which constitutes the first differential pair, and the source of the fifth N-channel MOS transistor MN5 are connected in common. The drain of the second P-channel MOS transistor MP2, which constitutes the first differential pair, and the source of the sixth N-channel MOS transistor MN6 are connected in common. The drain of the first N-channel MOS transistor MN1, which constitutes the second differential pair, and the source of the third P-channel MOS transistor MP3 are connected in common. The drain of the second N-channel MOS transistor MN2, which constitutes the second differential pair, and the source of the fourth P-channel MOS transistor MP4 are connected in common. The gate of the third N-channel MOS transistor MN3 is connected in common with the drain of the fifth N-channel MOS transistor MN5 and the drain of the third P-channel MOS transistor MP3. The output of the first current mirror circuit CM1 and the output of the second current mirror circuit CM2 are connected in common to an output terminal OUT. The gate of the first P-channel MOS transistor MP1 and the gate of the first N-channel MOS transistor MN1 are connected in common to an inverting input terminal In⁻, and the gate of the second P-channel MOS transistor MP2 and the gate of the second N-channel MOS transistor MN2 are connected in common to an noninverting input terminal In⁺. Here, the first and second current mirror circuits CM1 and CM2 have an input to output current ratio of 1:k (k>1). As in the conventional example, CMOS inverters cascode-connected in three stages after the differential amplifier are connected to constitute the voltage comparator circuit.

The operation of the circuit shown in FIG. 2 is the same as the one in FIG. 1 except that the circuit is symmetrical, therefore the explanation will be omitted.

Figure 3:
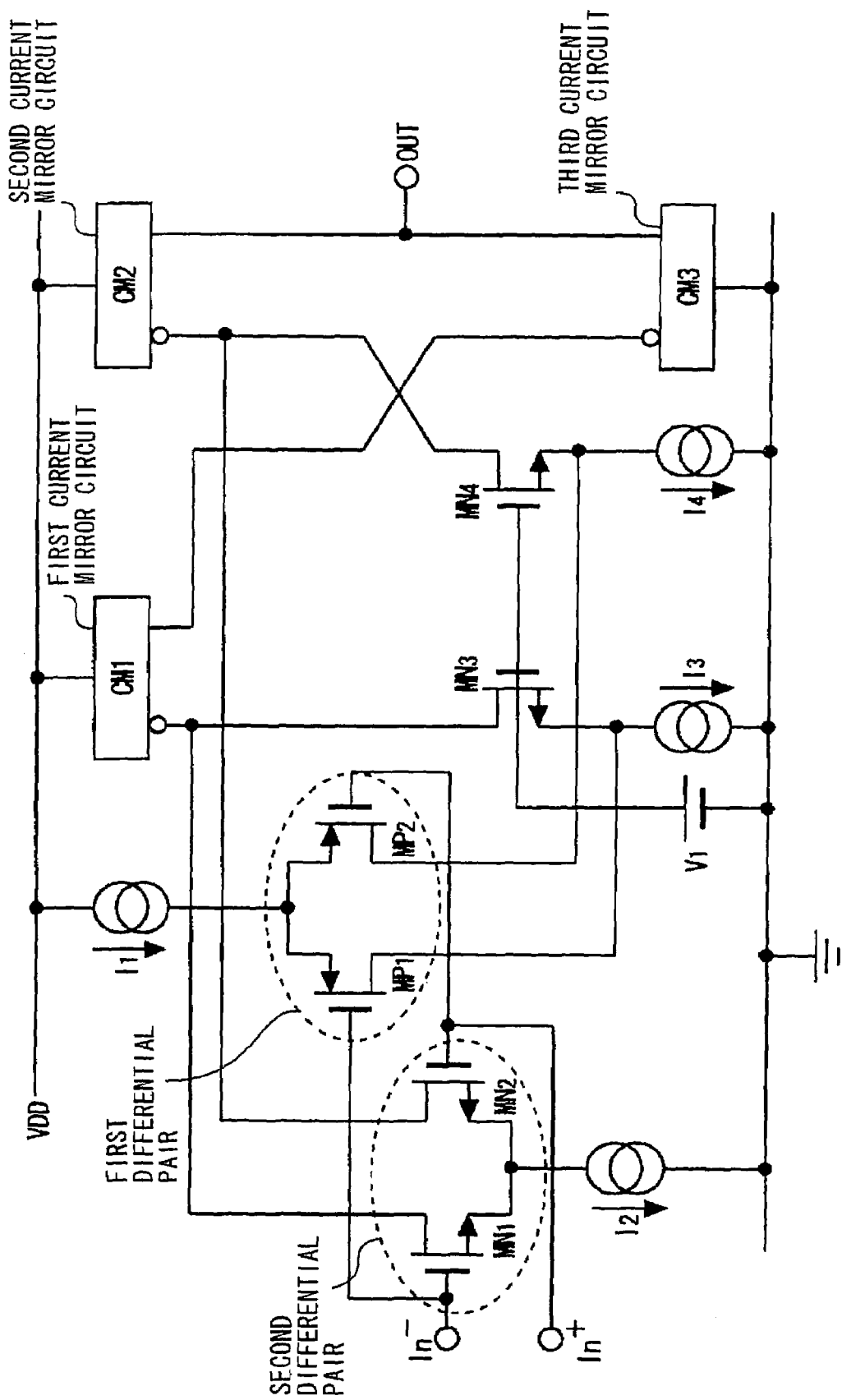
FIG. 3 is a drawing showing the circuit configuration of a differential amplifier of a third embodiment.
Figure 9:
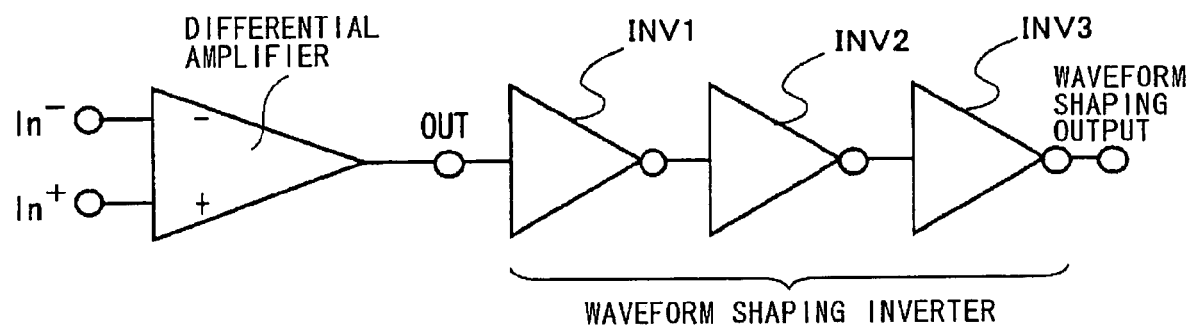
FIG. 9 is a drawing showing an example of the conventional voltage comparator circuit.
Figure 10:
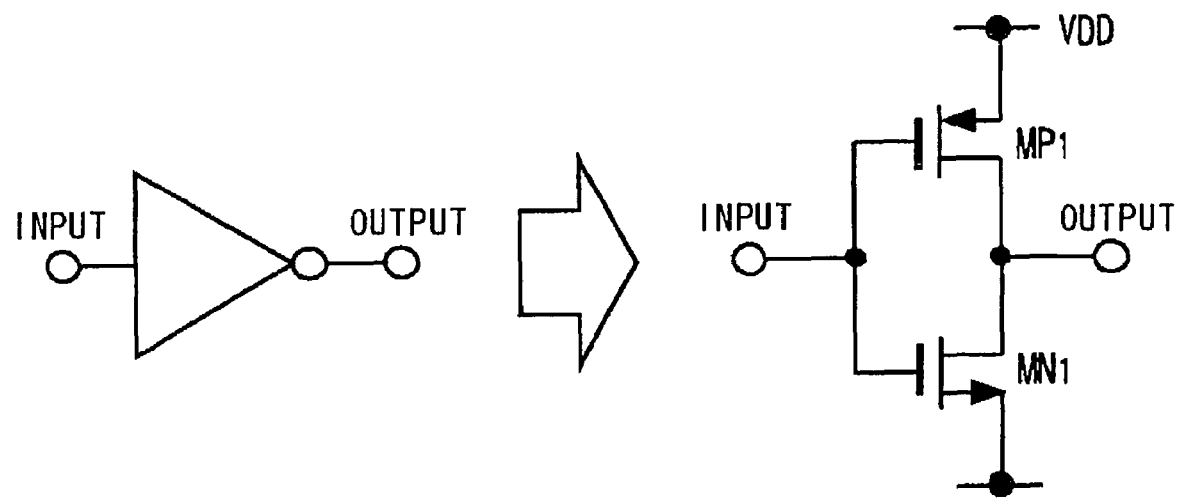
FIG. 10 is a drawing of a concrete example of a CMOS inverter circuit.

FIG. 3 is a drawing showing the configuration of a differential amplifier of a third embodiment according to the present invention. In reference to FIG. 3, the differential amplifier of the third embodiment comprises a first differential pair of a first P-channel MOS transistor MP1 and a second P-channel MOS transistor MP2, a second differential pair of a first N-channel MOS transistor MN1 and a second N-channel MOS transistor MN2, a third and fourth N-channel MOS transistors MN3 and MN4 with their respective gates connected in common to a first voltage source (V1), a first constant current source (I1) connected between the sources connected in common to the first differential pair and a positive power source VDD, a second constant current source (I2) connected between the sources connected in common to the second differential pair and a negative power source GND, a third constant current source (I3) connected between the source of the third N-channel MOS transistor MN3 and the negative power source (GND), a fourth constant current source (I4) connected between the source of the fourth N-channel MOS transistor MN4 and the negative power source (GND), a first current mirror circuit CM1 with its input terminal connected in common to the drain of the first N-channel MOS transistor MN1 and the drain of the third N-channel MOS transistor MN3 and its common terminal connected in common to the positive power source (VDD) terminal, a second current mirror circuit CM2 with its input terminal connected in common to the drain of the second N-channel MOS transistor MN2 and the drain of the fourth N-channel MOS transistor MN4 and its common terminal connected in common to the positive power source VDD terminal, and a third current mirror circuit CM3 with its input terminal connected to the output terminal of the first current mirror circuit CM1 and its common terminal connected to the negative power source (GND) terminal. And the drain of the first P-channel MOS transistor MP1 is connected to the source of the third N-channel MOS transistor MN3. The drain of the second P-channel MOS transistor MP2 is connected to the source of the fourth N-channel MOS transistor MN4. The output terminal of the second current mirror circuit CM2 and the output terminal of the third current mirror circuit CM3 are connected in common to an output terminal OUT. The gate of the first P-channel MOS transistor MP1 and the gate of the first N-channel MOS transistor MN1 are connected in common to an inverting input terminal In⁻, and the gate of the second P-channel MOS transistor MP2 and the gate of the second N-channel MOS transistor MN2 are connected in common to an noninverting input terminal In⁺. The second and third current mirror circuits CM2 and CM3 have an input to output current ratio of 1:k (k>1). As shown in FIG. 9, CMOS inverters (FIG. 10) are cascode-connected in three stages after the differential amplifier, and constitute the voltage comparator circuit.

Next, the operation of the differential amplifier shown in FIG. 3 will be explained. As the differential amplifiers shown in FIGS. 1 and 2, this differential amplifier in FIG. 3 has three modes of operation, however, an explanation on the case where both the P-channel differential pair and N-channel differential pair are operating, the main mode out of the three, will be given here.

Assuming a voltage higher on the side of In⁻ than that of In⁺ is inputted and it is a differential input voltage higher than indicated in Equation (7), the circuit shown in FIG. 9 operates as a comparator. All the bias current of the first differential pair $I_1$ flows to the second P-channel MOS transistor MP2. The current of the first P-channel MOS transistor MP1 becomes zero. On the other hand, all the bias current of the second differential pair $I_2$ flows to the first N-channel MOS transistor MN1 and the current of the second N-channel MOS transistor MN2 becomes zero. Looking at the bias current condition of each transistor at this time, the following Equations (80) and (81) hold where $I_{D(MN3)}$ is the drain current of the third N-channel MOS transistor MN3 and $I_{D(MN4)}$ is the drain current of the fourth N-channel MOS transistor MN4, since the fourth N-channel MOS transistor MN4's drain current $I_{D(MN4)}$ is the subtraction of a second P-channel MOS transistor MP2's drain current $I_{D(MP2)}$ from a current source I4 and the third N-channel MOS transistor MN3's drain current $I_{D(MN3)}$ is the subtraction of a first P-channel MOS transistor MP1's drain current $I_{D(MP1)}$ from a current source $I_3$:

$$I_{D(MN4)} = I_4 - I_{D(MP2)} = I_4 - I_1 \tag{81}$$

$$I_{D(MN3)} = I_3 - I_{D(MP1)} = I_3 \tag{81}$$

Here, the relationship among $I_1$, $I_3$, and $I_4$ is as follows:

$$I_3 = I_4 \geq I_1 \tag{82}$$

Next, an input current of the first current mirror circuit (CM1) $I_{in(CM1)}$ is given by the following Equation (83), where the input current:output current of the first current mirror circuit=1:1, since $I_{in(CM1)}$ is the sum of a first N-channel MOS transistor's drain current $I_{D(MN1)}$ and the third N-channel MOS transistor's drain current $I_{D(MN3)}$, and the same current becomes an output current of the first current mirror circuit $I_{out(CM1)}$:

$$I_{in(CM1)} = I_{D(MN1)} + I_{D(MN3)} = I_2 + I_3 = I_{out(CM1)} \tag{83}$$

Next, an input current of the second current mirror circuit (CM2) $I_{in(CM2)}$ is given by the following Equation (84) since $I_{in(CM2)}$ is the sum of a second N-channel MOS transistor's drain current $I_{D(MN2)}$ and the fourth N-channel MOS transistor's drain current $I_{D(MN4)}$:

$$I_{in(CM2)} = I_{D(MN2)} + I_{D(MN4)} = I_4 - I_1 \tag{84}$$

Further, the following Equation (85) holds where the input current:output current of the second current mirror circuit=1:1, since an output current of the second current mirror circuit $I_{out(CM2)}$ is the input current of the second current mirror circuit $I_{in(CM2)}$ multiplied by k:

$$I_{out(CM2)} = k I_{in(CM2)} = k(I_4 - I_1) \tag{85}$$

The input terminal of the third current mirror circuit (CM3) and the output terminal of the first current mirror circuit are connected in common. Therefore, the following Equation (86) holds since a third current mirror circuit (CM3)'s input current $I_{in(CM3)}$ is equal to the first current mirror circuit (CM1)'s output current $I_{out(CM1)}$:

$$I_{in(CM3)} = I_{out(CM1)} \tag{86}$$

Further, the following Equation (87) holds where the input current: output current of the third current mirror circuit (CM3)=1:k, since an output current of the third current mirror circuit (CM3) $I_{out(CM3)}$ is the input current of the third current mirror circuit (CM3) $I_{in(CM3)}$ multiplied by k:

$$I_{out(CM3)} = kI_{in(CM3)} = k(I_2 + I_3) \tag{87}$$

Therefore, an output current of the output terminal $I_{out}$ is the subtraction of the output current of the second current mirror circuit $I_{out(CM2)}$ from the output current of the third current mirror circuit $I_{out(CM3)}$ in the case where the current flows to the output terminal in a positive direction and the following Equation (88) holds where $I_3 = I_4$:

$$I_{out} = I_{out(CM3)} - I_{out(CM2)} = k(I_2 + I_3) - k(I_4 - I_1) = k(I_1 + I_2) \tag{88}$$

The output terminal OUT goes to a low level, and potentially it becomes 0V, nearly a negative power source (GND).

Next, assuming a voltage lower on the side of In⁻ than that of In⁺ is inputted, the differential amplifier shown in FIG. 3 operates as a comparator circuit, therefore, all the bias current of the first differential pair $I_1$ flows to the first P-channel MOS transistor MP1: The current of the second P-channel MOS transistor MP2 becomes zero. On the other hand, all the bias current of the second differential pair $I_2$ flows to the second N-channel MOS transistor MN2 and the current of the first N-channel MOS transistor MN1 becomes zero. Looking at the bias current condition of each transistor at this time, the following Equations (89) and (90) hold where $I_{D(MN3)}$ is the drain current of the third N-channel MOS transistor MN3 and $I_{D(MN4)}$ is the drain current of the fourth N-channel MOS transistor MN4:

$$I_{D(MN4)} = I_4 - I_{D(MP2)} = I_4 \tag{89}$$

$$I_{D(MN3)} = I_3 - I_{D(MP1)} = I_3 I_1 \tag{90}$$

Here, the relationship among $I_1$, $I_3$, and $I_4$ is as follows:

$$I_3 = I_4 \geq I_1 \tag{91}$$

Next, an input current of the first current mirror circuit (CM1) $I_{in(CM1)}$ is given by the following Equation (92), where the input current:output current of the first current mirror circuit=1:1, since $I_{in(CM1)}$ is the sum of a first N-channel MOS transistor's drain current $I_{D(MN1)}$ and the third N-channel MOS transistor's drain current $I_{D(MN3)}$, and the same current becomes an output current of the first current mirror circuit $I_{out(CM1)}$:

$$I_{in(CM1)} = I_{D(MN1)} + I_{D(MN3)} = I_3 - I_1 = I_{out(CM1)} \tag{92}$$

Next, an input current of the second current mirror circuit (CM2) $I_{in(CM2)}$ is given by the following Equation (93) since $I_{in(CM2)}$ is the sum of a second N-channel MOS transistor's drain current $I_{D(MN2)}$ and the fourth N-channel MOS transistor's drain current $I_{D(MN4)}$:

$$I_{in(CM2)} = I_{D(MN2)} + I_{D(MN4)} = I_2 + I_4 \tag{93}$$

Further, the following Equation (94) holds where the input current:output current of the second current mirror circuit=1:1, since an output current of the second current mirror circuit $I_{out(CM2)}$ is the input current of the second current mirror circuit $I_{in(CM2)}$ multiplied by k:

$$I_{out(CM2)} = kI_{in(CM2)} = k(I_2 + I_4) \tag{94}$$

The input terminal of the third current mirror circuit (CM3) and the output terminal of the first current mirror circuit are connected in common. Therefore, the following Equation (95) holds since a third current mirror circuit (CM3)'s input current $I_{in(CM3)}$ is equal to the first current mirror circuit (CM1)'s output current $I_{out(CM1)}$:

$$I_{in(CM3)} = I_{out(CM1)} \tag{95}$$

Further, the following Equation (96) holds where the input current:output current of the third current mirror circuit (CM3)=1:k, since an output current of the third current mirror circuit (CM3) $I_{out(CM3)}$ is the input current of the third current mirror circuit (CM3) $I_{in(CM3)}$ multiplied by k:

$$I_{out(CM3)} = kI_{in(CM3)} = k(I_3 - I_1) \tag{96}$$

Therefore, an output current of the output terminal $I_{out}$ is the subtraction of the output current of the second current mirror circuit $I_{out(CM2)}$ from the output current of the third current mirror circuit $I_{out(CM3)}$ in the case where the current flows from the output terminal in a positive direction and the following Equation (97) holds where $I_3 = I_4$:

$$I_{out} = I_{out(CM2)} - I_{out(CM3)} = k(I_2 + I_4) - k(I_3 - I_1) = k(I_1 + I_2) \tag{97}$$

The output terminal OUT goes to a high level, and potentially it becomes 0V, nearly a positive power source (VDD). The comparator operates as described above.

Figure 5:
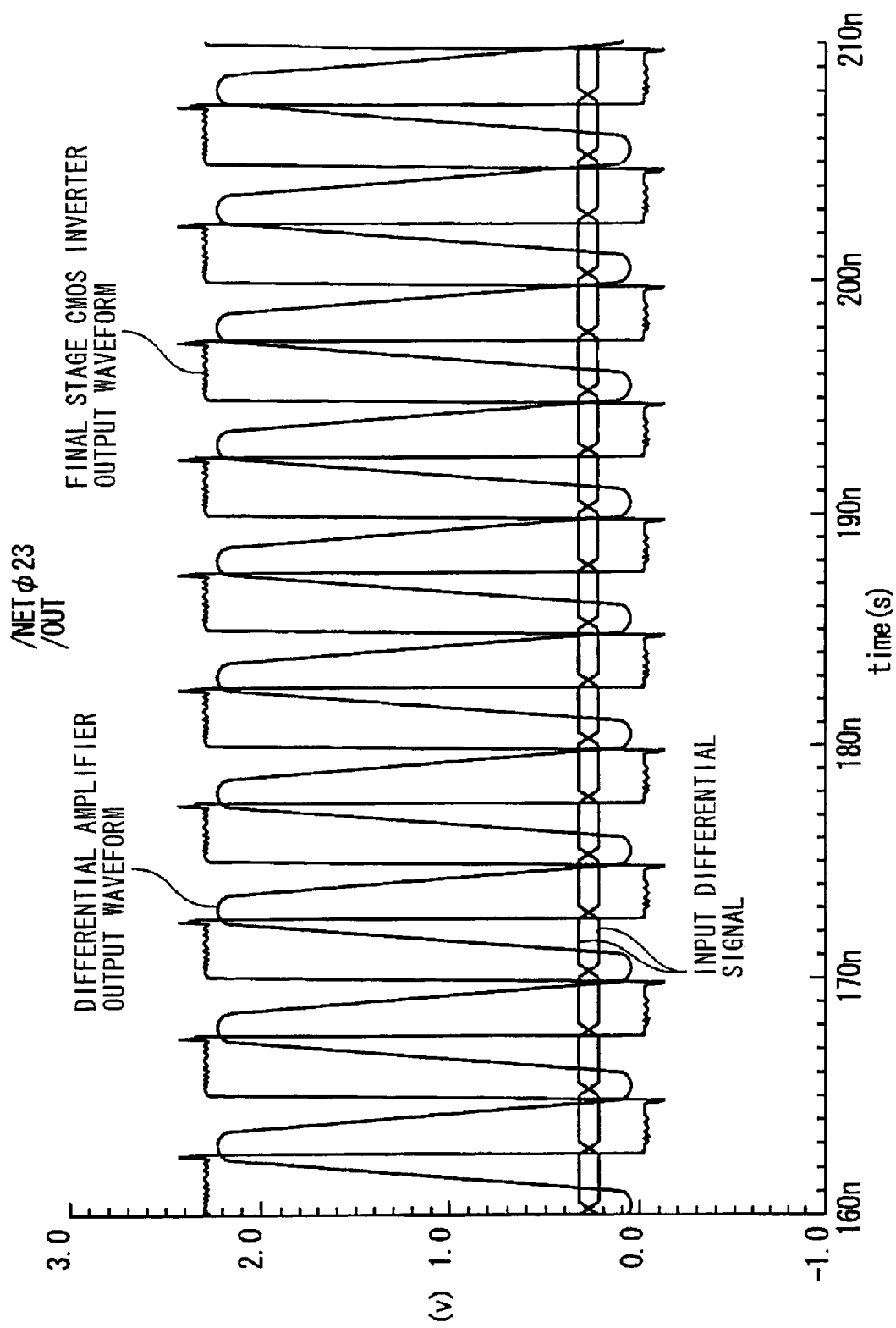
FIG. 5 is a drawing showing simulated input/output waveforms of the present invention.
Figure 6:
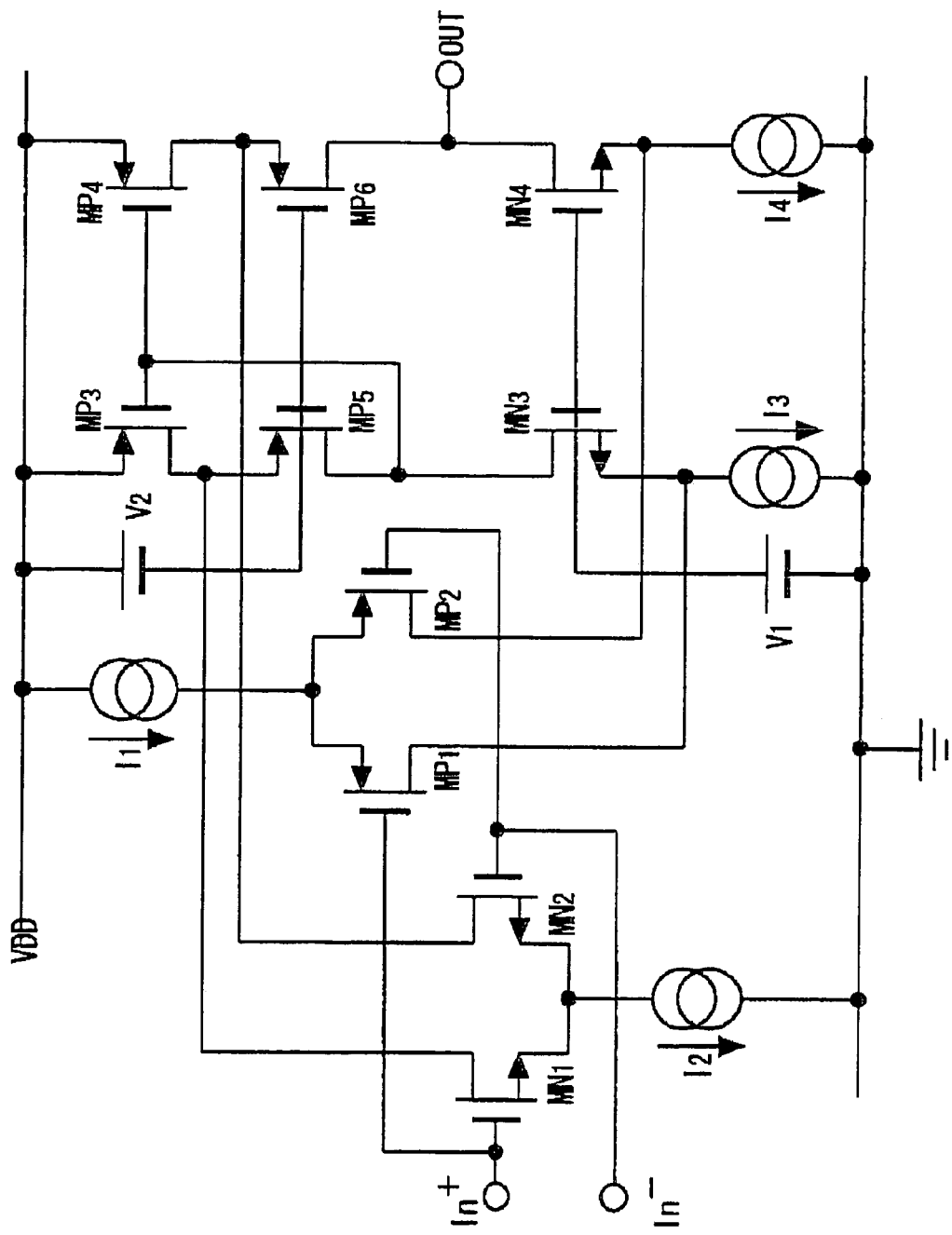
FIG. 6 is a drawing showing the circuit configuration of a conventional differential amplifier circuit.

FIG. 5 is a drawing showing an example of a circuit simulation result of the present embodiment. The differential amplifier shown in FIG. 1 is put into the structure shown in FIG. 9, and the output waveforms (simulation values) with an input differential signal frequency of 200 MHz, a differential amplitude of ±50 mV, and an in-phase signal voltage of 0.3V are shown in FIG. 5. As shown in FIG. 5, according to the present embodiment, the duty of the final output waveform of the CMOS inverters is nearly (essentially) 50%. In other words, the case where it ends up being far from 50% as in the simulation result of the conventional structure shown in FIG. 11 will not happen.

As describe above, the voltage comparator circuit of the present embodiment is especially suitable for a high-speed differential interface circuit with a low power supply voltage and wide input voltage range. According to the circuit of the present embodiment, a high-speed voltage comparator circuit with a wide input voltage range can be realized with a small number of elements and relatively low power consumption. The present invention is most suitable to be used for a semiconductor integrated circuit device for a high-speed differential interface circuit.

The present invention is described above with reference to some preferred embodiments, however, the present invention is not limited to the structures of the above embodiments, and it should be noted that it includes various modifications and revisions, which may be made possible by a manufacturer within the scope of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A differential amplifier comprising:

an input differential stage having first and second differential pairs of first and second-conductive types, which are driven by first and second current sources, respectively, and to which a differential input signal is inputted;

a folded cascode-type differential stage electrically connected as a load of differential outputs of said first and second differential pairs, the folded cascade-type differential stage generating folded differential outputs; and first and second current mirror circuits of first and second-conductive types connected to first and second power sources, respectively, the folded differential outputs being connected to respective inputs of the first and second current mirror circuits, outputs of the first and second current mirror circuits being connected in common to an output terminal;

wherein neither of the differential outputs and neither of the folded differential outputs is connected between the first mirror circuit and the first power source, and neither of the differential outputs and neither of the folded differential outputs is connected between the second mirror circuit and the second power source.

2. A differential amplifier comprising:

an input differential stage having first and second differential pairs of first and second-conductive types, which are driven by first and second current sources, respectively, and to which a differential input signal is inputted;

a folded cascode-type differential stage, which constitutes a load of differential outputs of said first and second differential pairs, and adds a differential output signal of said first differential pair and a differential output signal of said second differential pair, folds and outputs differentially the result; and first and second current mirror circuits of first and second-conductive types, which are disposed oppositely between first and second power sources, receive differential outputs of said folded cascode-type differential stage into their respective inputs, with their outputs connected in common to an output terminal;

wherein said folded cascode-type differential stage comprises at least first through third transistor pairs, whose control terminals are connected to each other, and two current sources between said first and second power sources, said first transistor pair connected to the side of said first power source and said second transistor pair constitute a cascode current mirror circuit, differential outputs of said first differential pair are connected respectively to connection points between said first transistor pair and said second transistor pair, differential outputs of said second differential pair are connected respectively to connection points between the other ends of said two current sources, whose one end is connected in common to said second power source, and said third transistor pair, and one output of said second transistor pair is connected to an input end of said second current mirror circuit, and one output of said third transistor pair is connected to an input end of said first current mirror circuit.

3. A differential amplifier comprising:

an input differential stage having first and second differential pairs of first and second-conductive types, which are driven by first and second current sources, respectively, and to which a differential input signal is inputted;

a folded cascode-type differential stage, which constitutes a load of differential outputs of said first and second differential pairs, and adds a differential output signal of said first differential pair and a differential output signal of said second differential pair, folds and outputs differentially the result; and first and second current mirror circuits of first and second-conductive types, which are disposed oppositely between first and second power sources, receive differential outputs of said folded cascode-type differential stage into their respective inputs, with their outputs connected in common to an output terminal;

wherein said folded cascode-type differential stage comprises at least first through third transistor pairs, whose control terminals are connected to each other, and two current sources between said first and second power sources, said first transistor pair connected to the side of said second power source and said second transistor pair constitute a cascode current mirror circuit, differential outputs of said first differential pair are connected respectively to connection points between the other ends of said two current sources, whose one end is connected in common to said first power source, and said third transistor pair, differential outputs of said second differential pair are connected respectively to connection points between said first transistor pair and said second transistor pair, and one output of said second transistor pair is connected to an input end of said first current mirror circuit, and one output of said third transistor pair is connected to an input end of said second current mirror circuit.

4. A differential amplifier comprising:

an input differential stage having first and second differential pairs of first and second-conductive types, which are driven by first and second current sources, respectively, and to which a differential input signal is inputted;

a folded cascode-type differential stage, which constitutes a load of differential outputs of said first and second differential pairs, and adds a differential output signal of said first differential pair and a differential output signal of said second differential pair, folds and outputs differentially the result; and first and second current mirror circuits of first and second-conductive types, which are disposed oppositely between first and second power sources, receive differential outputs of said folded cascode-type differential stage into their respective inputs, with their outputs connected in common to an output terminal;

wherein said folded cascode-type differential stage comprises at least a third current mirror circuit, a first transistor pair, whose respective gates are connected to each other, and two current sources between said first and second power sources, differential outputs of said first differential pair are connected to an input end of said third current mirror circuit and an input end of said first current mirror circuit respectively, differential outputs of said second differential pair are connected to said first transistor pair and connection points between said two current sources respectively, and one output of said first transistor pair is connected to an input end of said second current mirror circuit, and an output of said third current mirror circuit is connected to an input end of said second current mirror circuit.

5. The differential amplifier as defined in claim 1 wherein the current drive capability of an output end of said first and second current mirror circuits amounts to the current drive capability of the input end multiplied by k (where k is a prescribed number bigger than 1).

6. A voltage comparator comprising the differential amplifier as defined in claim 1 and a wave shaping circuit that receives the output of said differential amplifier.

7. The voltage comparator as defined in claim 6 wherein said wave shaping circuit comprises a buffer circuit and/or an inverter.

8. A semiconductor integrated circuit device comprising said differential amplifier as defined in claim 1.

9. A voltage comparator comprising a differential amplifier and inverters cascode-connected in multiple stages to an output of said differential amplifier wherein said differential amplifier comprises:
   a first differential pair of a first P-channel MOS transistor and a second P-channel MOS transistor;
   a second differential pair of a first N-channel MOS transistor and a second N-channel MOS transistor;
   a third and fourth N-channel MOS transistors with their respective gates connected in common and connected to a first voltage source;
   a third and fourth P-channel MOS transistors with their respective gates connected in common and their respective sources connected in common;
   a fifth and sixth P-channel MOS transistors with their respective gates connected in common and connected to a second voltage source;
   a first current mirror circuit with its input connected to the drain of said fourth N-channel MOS transistor and its common terminal connected to a first power source;
   a second current mirror circuit with its input connected to the drain of said sixth P-channel MOS transistor and its common terminal connected to a second power source;
   a first constant current source connected between the sources of said first differential pair connected in common and a first power source;
   a second constant current source connected between the sources of said second differential pair connected in common and the second power source;
   a third constant current source connected between the source of said third N-channel MOS transistor and the second power source; and
   a fourth constant current source connected between the source of said fourth N-channel MOS transistor and the second power source; wherein
   the drain of the first P-channel MOS transistor, which constitutes said first differential pair, is connected in common to the source of said third N-channel MOS transistor;
   the drain of the second P-channel MOS transistor, which constitutes said first differential pair, is connected in common to the source of said fourth N-channel MOS transistor;
   the drain of said first N-channel MOS transistor, which constitutes said second differential pair, the drain of said third P-channel MOS transistor, and the source of said fifth P-channel MOS transistor are connected in common;
   the drain of said second N-channel MOS transistor, which constitutes said second differential pair, the drain of said fourth P-channel MOS transistor, and the source of said sixth P-channel MOS transistor are connected in common;
   the gate of said third P-channel MOS transistor, the drain of said fifth P-channel MOS transistor, and the drain of said third N-channel MOS transistor are connected in common;
   an output of said first current mirror circuit and an output of said second current mirror circuit are connected in common to form an output terminal;
   the gate of said first P-channel MOS transistor and the gate of said first N-channel MOS transistor are connected in common to form an inverting input terminal; and
   the gate of said second P-channel MOS transistor and the gate of said second N-channel MOS transistor are connected in common to form a noninverting input terminal.

10. A voltage comparator comprising a differential amplifier and inverters cascode-connected in multiple stages to an output of said differential amplifier wherein said differential amplifier comprises:
   a first differential pair of a first P-channel MOS transistor and a second P-channel MOS transistor;
   a second differential pair of a first N-channel MOS transistor and a second N-channel MOS transistor;
   a third and fourth N-channel MOS transistors with their respective gates connected in common and their respective sources connected in common;
   a fifth and sixth N-channel MOS transistors with their respective gates connected in common and connected to a first voltage source;
   a third and fourth P-channel MOS transistors with their respective gates connected in common and connected to a second voltage source;
   a first current mirror circuit with its input connected to the drain of said sixth N-channel MOS transistor and its common terminal connected to a first power source;
   a second current mirror circuit with its input connected to the drain of said fourth P-channel MOS transistor and its common terminal connected to a second power source;
   a first constant current source connected between the sources of said first differential pair connected in common and a first power source;
   a second constant current source connected between the sources of said second differential pair connected in common and the second power source;
   a third constant current source connected between the source of said third P-channel MOS transistor and the first power source; and
   a fourth constant current source connected between the source of said fourth P-channel MOS transistor and the second power source; wherein
   the drain of the first P-channel MOS transistor, which constitutes said first differential pair, is connected in common to the source of said fifth N-channel MOS transistor and the drain of said third N-channel MOS transistor;
   the drain of the second P-channel MOS transistor, which constitutes said first differential pair, is connected in common to the source of said sixth N-channel MOS transistor and the drain of said fourth N-channel MOS transistor;

the drain of said first N-channel MOS transistor, which constitutes said second differential pair, and the source of said third P-channel MOS transistor are connected in common;

the drain of the second N-channel MOS transistor, which constitutes said second differential pair, and the source of said fourth P-channel MOS transistor are connected in common;

the gate of said third N-channel MOS transistor is connected in common to the drain of said fifth N-channel MOS transistor and the drain of said third P-channel MOS transistor;

an output of said first current mirror circuit and an output of said second current mirror circuit are connected in common to form an output terminal;

the gate of said first P-channel MOS transistor and the gate of said first N-channel MOS transistor are connected in common to form an inverting input terminal; and the gate of said second P-channel MOS transistor and the gate of said second N-channel MOS transistor are connected in common to form a noninverting input terminal.

11. The voltage comparator as defined in claim 9 wherein the input to output current ratio of said first and second current mirror circuits is input current: output current=1:k (where k is a number bigger than 1).

12. The voltage comparator as defined in claim 10 wherein the input to output current ratio of said first and second current mirror circuits is input current: output current=1:k (where k is a number bigger than 1).

13. A voltage comparator comprising a differential amplifier and inverters cascode-connected in multiple stages to the output of said differential amplifier wherein said differential amplifier comprises:

a first differential pair of a first P-channel MOS transistor and a second P-channel MOS transistor;

a second differential pair of a first N-channel MOS transistor and a second N-channel MOS transistor;

a third and fourth N-channel MOS transistors with their respective gates connected in common and connected to a first voltage source;

a first constant current source connected between the sources of said first differential pair connected in common and a first power source;

a second constant current source connected between the sources of said second differential pair connected in common and a second power source;

a third constant current source connected between the source of said third N-channel MOS transistor and the second power source;

a fourth constant current source connected between the source of said fourth N-channel MOS transistor and the second power source;

a first current mirror circuit with its input terminal connected in common to the drain of said first N-channel MOS transistor and the drain of said third N-channel MOS transistor, and its common terminal connected in common to the first power source terminal;

a second current mirror circuit with its input terminal connected in common to the drain of said second N-channel MOS transistor and the drain of said fourth N-channel MOS transistor, and its common terminal connected in common to the first power source terminal; and a third current mirror circuit with its input terminal connected to the output terminal of said first current mirror circuit, and its common terminal connected to the second power source; and the drain of said first P-channel MOS transistor is connected to the source of said third N-channel MOS transistor;

the drain of said second P-channel MOS transistor is connected to the source of said fourth N-channel MOS transistor;

an output terminal of said second current mirror circuit and an output terminal of said third current mirror circuit are connected in common to form an output terminal;

the gate of said first P-channel MOS transistor and the gate of said first N-channel MOS transistor are connected in common to an inverting input terminal; and the gate of said second P-channel MOS transistor and the gate of said second N-channel MOS transistor are connected in common to a noninverting input terminal.

14. The voltage comparator as defined in claim 13 wherein the input to output current ratio of said second and third current mirror circuits is input current: output current=1:k (k>1).

15. A semiconductor integrated circuit device comprising the voltage comparator as defined in claim 9.

16. A semiconductor integrated circuit device comprising the voltage comparator as defined in claim 10.

17. A semiconductor integrated circuit device comprising the voltage comparator as defined in claim 11.

18. A semiconductor integrated circuit device comprising the voltage comparator as defined in claim 12.

19. A semiconductor integrated circuit device comprising the voltage comparator as defined in claim 13.

20. A semiconductor integrated circuit device comprising the voltage comparator as defined in claim 14.

21. The differential amplifier of claim 1, wherein the folded and differentially output result from the folded cascode-type differential stage is not rail-to-rail in level; and wherein the outputs connected in common to the output terminal are rail-to-rail in level.

* * * * *